(12) United States Patent
McLean et al.

(10) Patent No.: US 12,066,473 B2
(45) Date of Patent: Aug. 20, 2024

(54) RADIATION DETECTION WITH NON-PARAMETRIC DECOMPOUNDING OF PULSE PILE-UP

(71) Applicant: Southern Innovation International Pty Ltd, Carlton North (AU)

(72) Inventors: Christopher McLean, Kangaroo Flat (AU); Michael Pauley, Carlton North (AU); Jonathan Manton, Carlton North (AU)

(73) Assignee: Southern Innovation International Pty Ltd, Carlton North (AU)

( * ) Notice: Subject to any disclaimer, the term of this patent is extended or adjusted under 35 U.S.C. 154(b) by 166 days.

(21) Appl. No.: 17/593,312

(22) PCT Filed: Mar. 23, 2020

(86) PCT No.: PCT/AU2020/050275
§ 371 (c)(1),
(2) Date: Sep. 15, 2021

(87) PCT Pub. No.: WO2020/191435
PCT Pub. Date: Oct. 1, 2020

(65) Prior Publication Data
US 2022/0137111 A1   May 5, 2022

(30) Foreign Application Priority Data

Mar. 22, 2019 (AU) ................................ 2019900974

(51) Int. Cl.
*G01R 23/15* (2006.01)
*G01R 23/16* (2006.01)
(Continued)

(52) U.S. Cl.
CPC ............ *G01R 23/15* (2013.01); *G01R 23/16* (2013.01); *G01T 1/36* (2013.01); *G01R 29/033* (2013.01)

(58) Field of Classification Search
CPC ...... G01R 23/15; G01R 23/16; G01R 29/033; G01T 1/36
See application file for complete search history.

(56) References Cited

U.S. PATENT DOCUMENTS 3,872,287 A * 3/1975 Koeman ................... G01T 1/36
250/370.06
6,590,957 B1   7/2003 Warburton et al.
(Continued)

OTHER PUBLICATIONS

Gugushvili, Shota. "Decompounding under Gaussian noise." *arXiv preprint* arXiv:0711.0719 (2007).
(Continued)

*Primary Examiner* — David P Porta
*Assistant Examiner* — Fani Polyzos Boosalis
(74) *Attorney, Agent, or Firm* — Knobbe, Martens, Olson & Bear, LLP

(57) ABSTRACT

A method of determining a spectrum of energies of individual quanta of radiation received in a radiation detector is disclosed. Spectrum sensitive statistics are computed from a time series of digital observations from the radiation detector, defining a mapping from a density of amplitudes of the pulses to the spectrum sensitive statistics. The spectrum is determined by estimating the density of amplitudes of the pulses by applying an inversion of the mapping to the spectrum sensitive statistics. The statistics may be based on a first set of nonoverlapping time intervals of constant length L at least as long as a duration of the pulses without regard to entirety of clusters of the pulses; and a second set of nonoverlapping time intervals of constant length L1 less (Continued)

than L also without regard to entirety of clusters of the pulses. A method of estimating count rate is also disclosed.

15 Claims, 13 Drawing Sheets

(51) Int. Cl.
*G01T 1/36* (2006.01)
*G01R 29/033* (2006.01)

(56) References Cited

U.S. PATENT DOCUMENTS

| | | |
|---|---|---|
| 2008/0025385 A1 | 1/2008 | Barat et al. |
| 2012/0041700 A1 | 2/2012 | Scoullar et al. |
| 2014/0029819 A1 | 1/2014 | Zeng et al. |
| 2016/0161390 A1 | 6/2016 | Greiner |
| 2018/0204356 A1 | 7/2018 | Xia et al. |
| 2020/0170586 A1* | 6/2020 | Takahashi ................. G01T 1/36 |

OTHER PUBLICATIONS

International Search Report received in PCT/AU2020/050275, mailed Jun. 9, 2020.
Extended European Search Report received in EP Application No. 20777486.0, mailed Nov. 18, 2022.

* cited by examiner

RADIATION DETECTION WITH NON-PARAMETRIC DECOMPOUNDING OF PULSE PILE-UP

FIELD OF THE INVENTION

A novel method is provided for estimating the energy distribution of quanta of radiation such as photons incident upon a detector in spectroscopic systems such as in X-ray or gamma-ray spectroscopy. The method is particularly useful for count-rate regimes where pulse pile-up is an issue. A key step in the derivation of the estimator of an embodiment of the invention is the novel reformulation of the problem as a decompounding problem of a compound Poisson process. The method can be applied to any form of radiation detector detecting quanta or other corpuscles of radiation, such as x-rays, gamma rays or other photons, neutrons, atoms, molecules, or seismic pulses. Applications of spectroscopy from such detectors are well known. Such applications are described widely in the prior art, including in international patent applications PCT/AU2005/001423, PCT/AU2009/000393, PCT/AU2009/000394, PCTAU2009/000395, PCT/AU2009/001648, PCT/AU2012/000678, PCT/AU2014/050420, PCT/AU2015/050752, PCT/AU2017/050514, and PCT/AU2017/050512, each of which is incorporated herein in its entirety for the purpose of describing potential applications of the current invention and any other background material needed to understand the current invention.

1 BACKGROUND

X-RAY and gamma-ray spectroscopy underpin a wide range of scientific, industrial and commercial processes. One goal of spectroscopy is to estimate the energy distribution of photons incident upon a detector. From a signal processing perspective, the challenge is to convert the stream of pulses output by a detector into a histogram of the area under each pulse. Pulses are generated according to a Poisson distribution whose rate corresponds to the intensity of X-rays or gamma-rays used to illuminate the sample. Increasing the intensity results in more pulses per second on average and hence a shorter time before an accurate histogram is obtained. In applications such as baggage scanning at airports, this translates directly into greater throughput. Pulse pile-up occurs when two or more pulses overlap in the time domain. As the count rate (the average number of pulses per second) increases so does the incidence of pulse pile-up. This increases the difficulty in determining the number of pulses present and the area under each pulse. In the limit, the problem is ill-conditioned: if two pulses start at essentially the same time, their superposition is indistinguishable from a single pulse. The response of an X-ray or gamma-ray detector to incident photons can be modelled as the superposition of convolutions of pulse shape functions $\Phi_j(t)$ with Dirac-delta impulses, $$r(t) = \sum_{j=-\infty}^{\infty} a_j \delta(t - \tau_j) \star \Phi_j(t). \tag{1}$$

The arrival times $\ldots, \tau_{-1}, \tau_0, \tau_1, \ldots$ are unknown and form a Poisson process. Each photon arrival is modelled as a Dirac-delta at time $\tau_j$, and with amplitude $a_j$ that is proportional to the photon energy and induces a detector pulse shape response $\Phi_j$. The amplitudes $a_j$ are realizations of identically distributed random variables $A_j$ whose common probability density function $f_A(x)$ is unknown. The pulse shape function $\Phi_j$ is determined by the geometry of the detector and the photon interaction. In some systems the variation in pulse shape is minimal and may be ignored, while other systems (e.g., HPGe) individual pulse shapes may differ significantly from one another ill. It is assumed all pulse shapes are causal i.e., $\Phi_j(t)=0$ for $t<0$, uni-modal, of finite energy, and decay exponentially toward zero as $t \to \infty$. The integral of the pulse shape functions are normalized to unity, i.e., $\int_{-\infty}^{\infty} \Phi_j(t) \, dt = 1$, so that the area under the pulse is given by $A_j$. The observed signal consists of the detector output corrupted by noise, i.e., $$s(t) = r(t) + w(t). \tag{2}$$

The mathematical goal of pulse pile-up correction is to estimate $f_A(x)$ given a uniformly-sampled, finite-length version of $s(t)$. We assume throughout that the noise distribution $w(t)$ is zero-mean Gaussian with known variance $\sigma^2$. We also assume the photon arrival times form a homogeneous Poisson process with a known rate. Consisting of the detector response R corrupted by a noise process W, where $S_k$, $R_k$ and $W_k$ represent the kth elements of each series and where $0 \leq k < K$. Let S, R and W be the uniformly sampled time-series corresponding to these signals, $$S = R + W \tag{3}$$

$$= \{s(t_k) : 0 \leq k < K\} \tag{4}$$

$$R = \{r(t_k) : 0 \leq k < K\} \tag{5}$$

$$W = \{W_{t_k} : 0 \leq k < K\} \tag{6}$$

where $t_0 < t_1 < \ldots < t_{K-1}$.

Summary of Pulse Processing Methodologies: Numerous approaches have been proposed over the decades to address the issue of pulse pile-up. Approaches can be broadly categorized into two types: time-domain based and energy-domain based. A popular strategy is to attempt to detect when pile-up has occurred in the time domain, and either reject or compensate for the affected pulses. Early spectroscopic systems adopted a rejection-based approach along with matched filtering. The disadvantage of this approach is that an increasing proportion of pulses are rejected as the probability of pile-up grows. The system rapidly succumbs to paralysis, placing an upper limit on the count rate [1]. Strategies that compensate or correct for pile-up have grown in number with the increase of cheap computational power. These include template fitting [2], baseline subtraction [3], adaptive filtering [4, 5], sparse regression [6, 7] and more. These approaches all attempt to identify and compensate for pile-up in the time domain, and are generally best suited to systems with low pulse shape variation. The complexity of these approaches increases significantly with increasing variability between pulse shapes $\Phi_j$. It can be shown that any method that attempts to characterise individual pulses will suffer from pile-up. The best that these approaches can do is to reduce the onset of pile-up. Energy-based approaches attempt to address pile-up based on the statistics of an ensemble of pulses rather than individual pulses. They typically operate on histograms of estimated energy (the areas under clusters of pulses). The early work of Wielopolski and Gardner [8] and more recent extensions of their idea [9] operate primarily in the energy domain using ensemble-based strategies. Trigano et al. [10, 11] estimate the incident spectrum utilizing marginal densities from the joint distribution of the statistical properties of variable length clusters of pulses where the beginning and end of each cluster is detected. This circumvents the need to identify individual pulses, and is robust to pulse shape variation. Ilhe et al. [12] examine exponential shot-noise processes, restricting pulse shapes to a simple exponential to obtain tractable results. Further work [13] has been done to allow a wider range of pulse shapes. In both cases, knowledge is required of the pulse shape, along with estimates of the characteristic function and its derivative.

2 SUMMARY OF THE INVENTION

We chose an energy-based pile-up correction approach in order to i) avoid the limitations associated with the detection of individual pulses [14] and to ii) be able to handle pulse shape variation without undue increase in computational complexity. Rather than utilizing the joint distribution [10, 11] or shot-process [12] approaches, we recast the pile-up problem as a 'decompounding' problem of a compound Poisson process. A compound Poisson process is a discrete-time random process where each component consists of the sum of a random number of independent identically distributed random variables, where the number of random variables in each sum is Poisson distributed [15]. 'Decompounding' of a compound Poisson process is the task of using the random sums to estimate the distribution from which the random variables have been drawn. Buchmann and Grübel [16] formulated the decompounding of compound Poisson processes in the context of insurance claims and queuing theory. Decompounding of uniformly sampled compound Poisson processes has received some attention in recent times [16, 17, 18, 12, 19]. The context of these derivations frequently assume (reasonably) that each event is detectable (i.e., there is no ambiguity regarding the number of events), or that the density estimators are conditioned on at least one event occurring in each observation [20]. These assumptions are of limited value when addressing the spectroscopic pile-up problem.

The investigation of non-parametric decompounding without conditioning on event detection has received relatively little attention in the literature. Gugushvili [18] proposes a non-parametric, kernel-based estimator for the decompounding problem in the presence of Gaussian noise. In embodiments of the invention, the inventors have conceived that once a method for selecting the kernel bandwidth is obtained, along with a method for transforming the observed detector output to fit the mathematical model, this estimator can be readily extended and applied to a reformulation of the spectroscopic pile-up problem.

In accordance with a first broad aspect of the invention there is provided a method of determining a spectrum of energies of individual quanta of radiation received in a radiation detector, the method comprising the steps of: (1) obtaining a time series of digital observations from the radiation detector comprising pulses corresponding to the detection of the individual quanta; (2) computing spectrum sensitive statistics from the detector signal, the spectrum sensitive statistics defining a mapping from a density of amplitudes of the pulses to a spectrum sensitive statistics; (3) determining the spectrum by estimating the density of amplitudes of the pulses by applying an inversion of the mapping to the spectrum sensitive statistics.

In embodiments, the spectrum sensitive statistics may be based on a sum of the digital observations over a plurality of time intervals and the mapping may be defined using an approximate compound Poisson process, which may be augmented by a modelled noise. The mapping may be expressed as a relation between characteristic functions of the amplitudes, the spectrum sensitive statistics and the modelled noise. The characteristic functions of the spectrum sensitive statistics may be computed with the use of a histogram of the sum of the digital observations to which is applied an inverse Fourier transform. Computation of a characteristic function of the amplitudes may comprise the use of a low pass filter.

In a first embodiment, the plurality of time intervals are nonoverlapping and have have a constant length L and each interval is selected to encompass zero or more approximately entire clusters of the pulses. This may be accomplished by requiring a maximum value of the detector signal at a beginning and end of each time interval. In this embodiment, the compound Poisson process may be defined as a sum of the amplitudes of the pulses in each time interval. The mapping may be expressed as defined in equations (40) and (41), which may be augmented by windowing functions.

In a second embodiment, a plurality of intervals comprise a first set of nonoverlapping time intervals constant length L selected without regard to entirety of clusters of the pulses, and a 2nd set of nonoverlapping time intervals of constant length L1 less than L also selected without regard to entirety of clusters of the pulses. L is at least as long as a duration of the pulses and preferably L1 is less than the duration of the pulses. In this embodiment, the compound Poisson process may be defined as in Section 6. The mapping may be expressed as defined in Section 6. The second embodiment may utilise processes and calculations for each set of time intervals as defined for the set of time intervals in the first embodiment.

In embodiments, a data-driven strategy is used that results in a near optimal choice for a kernel parameter, which minimises the integrated-square-of-errors (ISE) of the estimated probability density function of incident photon energies.

According to a second broad aspect of the invention there is provided a method of estimating count rate of individual quanta of radiation received in a radiation detector, the method comprising the steps of: (1) obtaining a time series of digital observations from the radiation detector comprising pulses corresponding to the detection of the individual quanta; (2) computing spectrum sensitive statistics from the detector signal, the spectrum sensitive statistics using the intervals of constant length L and constant length L1 as described above in relation to the 1st broad aspect; (3) determining an estimate of a characteristic function of the compound Poisson process using formula (109); (4) estimating the count rate from the estimate of the characteristic function. Step (4) above may be achieved by using an optimisation routine or some other means to fit a curve, estimating a DC offset of a logarithm of the estimate of the characteristic function, or fitting a curve to the logarithm of the estimate of the characteristic function.

The rest of this application is organized as follows. Sections 3, 4 and 5 relate to the 1st embodiment of the 1st aspect of the invention. Sections 3 provides preliminary background, defines notation, outlines the mathematical model and gives a derivation of the estimator of the 1st embodiment, including modifications. Section 4 shows the performance of the modified estimator of the 1st embodiment for both simulated and experimental data, and discusses the results. Section 5 provides a conclusion for the 1st embodiment. Section 6 describe the 2nd embodiment, with reference to the 1st embodiment where relevant. Section 7 describes the 2nd aspect of the invention, a novel method of estimating count rate.

3 DERIVATION OF ESTIMATOR OF THE FIRST EMBODIMENT

Figure 1:
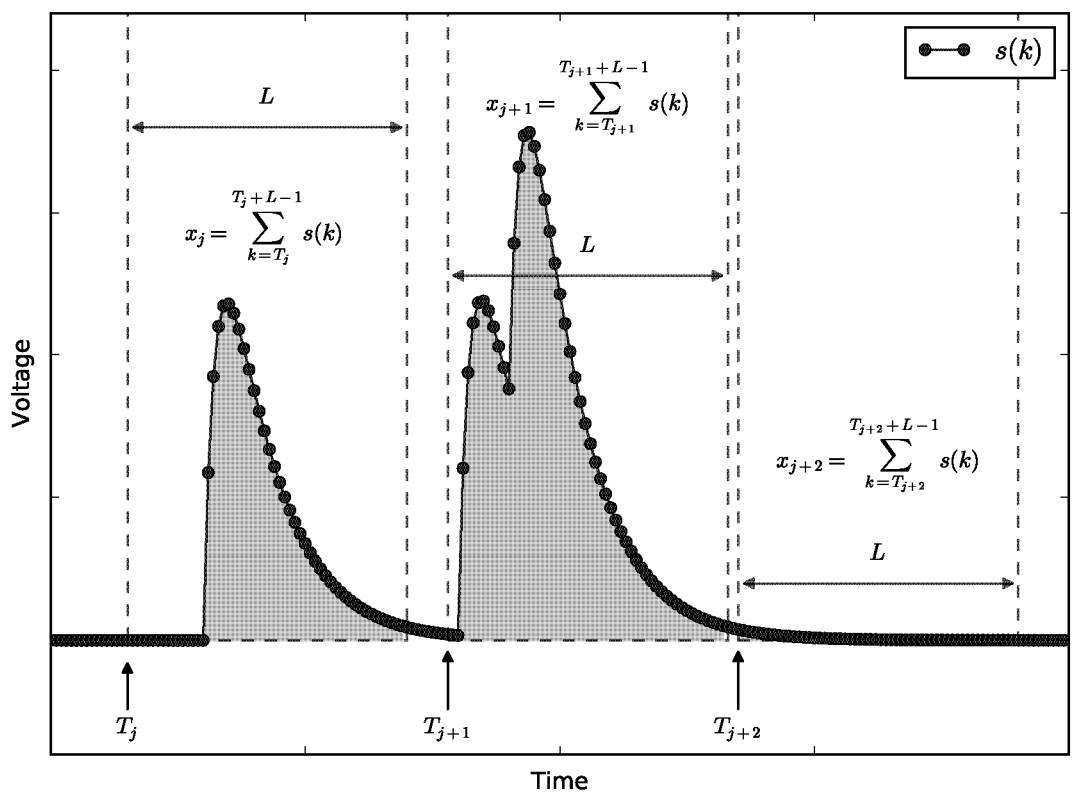
FIG. 1 shows the relationship between realizations of the interval Y and the sampled detector response.

The general approach we take to addressing pile-up is based on the following strategy; i) obtain statistics from s(t) that are sensitive to the distribution of incident photon energies, and estimate those statistics using the observed, finite-length sampled version of s(t), ii) obtain a mapping from the density of incident photon energies to the statistical properties of the observed statistics, iii) estimate the density of the incident photon energies by inverting the mapping. Section 3.1 describes our choice of statistics. Section 3.2 argues that these statistics (approximately) have the same distribution as a compound Poisson process. Section 3.3 introduces a decompounding technique for recovering the spectrum from these statistics. It is based on the decompounding algorithm in [18] but further developed to obtain near optimal performance in terms of the integrated square of error. Our approach to the pile-up problem follows the general theme of finding some statistics of s(t) that are sensitive to the underlying spectrum, estimating these statistics from a finite-time sampled version of s(t), then inverting the map that describes the statistical properties of these statistics given the underlying spectrum, thereby producing an estimate of the spectrum.

3.1 Choice of Statistic

We wish to obtain estimates of the photon energies from the observed signal given in (2). In typical modern spectroscopic systems, the detector output s(t) is uniformly sampled by an ADC. Without loss of generality, we assume the raw observations available to the algorithm are $\{s(k): k \in \mathbb{Z}_{\geq 0}\}$. Since identification of individual pulses can be difficult, we look instead for intervals of fixed length $L \in \mathbb{Z}_{>0}$ containing zero or more clusters of pulses. Precisely, we define these intervals to be $[T_j, T_j+L)$ where $$T_0 = \inf\{k : |s(k)| \leq \epsilon, |s(k+L)| \leq \epsilon, k \in \mathbb{Z}_{\geq 0}\} \quad (7)$$

$$T_j = \inf\{k : |s(k)| \leq \epsilon, |s(k+L)| \leq \epsilon, T_{j-1}+L \leq k, k \in \mathbb{Z}_{\geq 0}\}. \quad (8)$$

Here, ε is chosen as a trade-off between errors in the energy estimate and the probability of creating an interval. The value of ε should be sufficiently small to ensure the error in the estimate of total photon energy arriving within each interval is acceptably low, yet sufficiently large with respect to the noise variance to ensure a large number of intervals are obtained. Although the probability of partitioning the observed data into intervals approaches zero as the count-rate goes to infinity, this approach succumbs to paralysis at higher count-rates compared to pile-up rejection strategies based on individual pulses, since multiple photons are permitted to pile-up within in each interval. Section 4.2 describes the selection of L and ε for real data. Each interval contains an unknown, random number of pulses and may contain zero pulses.

We estimate the total photon energy $x_j$ in the interval $[T_j, T_j+L)$ using the sampled raw observations. Since the area under each pulse is proportional to the photon energy $A_j$ defined in (1), we let $$x_j = \sum_{k=T_j}^{T_j+L-1} s(k) \quad (9)$$

The number of photon arrivals, the energy of each arriving photon and the detector output noise in each interval $[T_j, T_j+L)$ are assumed to be random and independent of other intervals. For pulse shapes with exponential decay, a small amount of the photon energy arriving in an interval may be recorded in the next interval. The amount of leakage is proportional to ε, and is negligible for sufficiently small ε. Consequently, the estimates $x_1, x_2, \ldots$ may be treated as the realization of a weakly-dependent, stationary process where each estimate is identically distributed according to the random variable X. This relationship is illustrated in FIG. 1 for the noise free case using a typical pulse shape.

3.2 Approximation with Compound Poisson Process

In this subsection we describe the distribution of X in terms of $f_A(x)$. We will then invert this in section 3.3, to obtain an estimator for the density $f_A(x)$. Using (9), (2), (1) and the fact that $\Phi_\ell(t)$ is causal we have $$x_j = \sum_{\{\ell : \tau_\ell < T_j\}} \sum_{k=T_j}^{T_j+L-1} a_\ell \Phi_\ell(k-\tau_\ell) + \sum_{\{\ell : T_j \leq \tau_\ell < T_j+L\}} \sum_{k=T_j}^{T_j+L-1} a_\ell \Phi_\ell(k-\tau_\ell) + \sum_{k=T_j}^{T_j+L-1} w(k) \quad (10)$$

As justified below, this simplifies to $$x_j \approx y_j + z_j \qquad (11)$$

$$\text{where } y_j = \sum_{\{\ell: T_j \leq \tau_\ell < T_j+L\}} a_\ell \qquad (12)$$

$$\text{and } z_j = \sum_{k=T_j}^{T_j+L-1} w(k). \qquad (13)$$

Both $y_j$ and $z_j$ are i.i.d. sequences of random variables. We denote their distributions by Y and Z. The distribution of Z is fully determined from the distribution of w(t), which is assumed zero-mean Gaussian with known variance $\sigma^2$. Moreover, Y is a compound Poisson process since the number of terms in the summation (number of photon arrivals in an interval of length L) has Poisson statistics. Equations (11)-(13) are justified as follows. The first term of (10) represents leakage from earlier intervals and is approximately zero. This is easily shown for Gaussian noise by performing a Taylor expansion about $\epsilon=0$ $$Pr(|s(k)| < \epsilon) = \frac{1}{2}\text{erf}\left(\frac{r(k)+\epsilon}{\sqrt{2}\,\sigma}\right) - \frac{1}{2}\text{erf}\left(\frac{r(k)-\epsilon}{\sqrt{2}\,\sigma}\right) \qquad (14)$$

$$\approx 0.79785\frac{\epsilon}{\sigma}e^{-\frac{r(k)^2}{2\sigma^2}} + O(\epsilon^3). \qquad (15)$$

Thus there is a finite but small probability that some energy belonging to a previous interval will be included in the current estimate. In practice, this contribution is comparable to the noise for sufficiently small E. The third term in (10) is zero since $\Phi_\ell(t)$ is causal. The second term in (10) can be written as $$\sum_{\{\ell: T_j \leq \tau_\ell < T_j+L\}} a_\ell \sum_{k=T_j}^{T_j+L-1} \Phi_\ell(k-\tau_\ell) \approx \sum_{\{\ell: T_j \leq \tau_\ell < T_j+L\}} a_\ell \qquad (16)$$

where we assume the pulse shapes $\Phi_\ell(t)$ are sufficiently smooth such that $$\sum_{k=T_j}^{T_j+L-1} \Phi_\ell(k-\tau_\ell) \approx \int_{-\infty}^{\infty} \Phi_\ell(t)dt = 1.$$

It approximates the total energy of all the photons arriving in the interval $[T_j, T_j+L)$. Let $v_j$ designate the number of photon arrivals in the interval $[T_j, T_j+L)$. We assume $v_j$ is a realization of a homogeneous Poisson process with rate parameter $\lambda$, where $\lambda$ is expressed in terms of the expected number of photons per interval of length L. Henceforth we shall assume that (11) holds exactly, and write $$X = Y + Z \qquad (17)$$

Finally, we write $x_j$ as $$x_j \approx y_j + z_j \qquad (18)$$

where we assume Z has known variance $\sigma^2$. In this subsection we model the statistic of section 3.1 using a compound Poisson process. This allows us to derive an estimator for the density $f_A(x)$ in terms of observable quantities. The number of photons arriving in the interval $[T_j, T_j+L)$ is a Poisson random variable which we designate $v_j$. The total energy in the interval Y can be modelled as a compound Poisson process i.e., $$y_j = \begin{cases} \sum_{k=0}^{v_j-1} a_{(\ell_{j,1}+k)}, & v_j > 0 \\ 0 & v_j = 0 \end{cases} \qquad (19)$$

$$v_j \sim Pn(\lambda) \qquad (20)$$

where $\ell_{j,1} = \min\{\ell : T_j \leq \tau_\ell < T_j+L\}$ is the index of the first-photon arrival time in the interval, the arrival times are assumed ordered, and $a_{(\ell_{j,1}+k)}$ representing photon energy are independent realizations of the random variable A with density function $f_A(x)$. The $\{v_j\}$ form a homogeneous Poisson process with rate parameter $\lambda$. The Poisson rate $\lambda$ is expressed in terms of the expected number of photons per interval of length L.

$$y_j \approx \sum_{k=T_j}^{T_j+L} r(k). \qquad (21)$$

The relationship between realizations of Y and the sampled detector response is illustrated in FIG. 1. The observed $x_j$ can be approximated in terms of the $y_j$ by substituting (2) into (9), $$x_j = \sum_{k \in [\hat{T}_j, \hat{T}_j+L]} (r(k) + w(k)) \qquad (22)$$

$$x_j = \sum_{k=T_j}^{T_j+L} r(k) + \sum_{k=T_j}^{T_j+L} w(k) \qquad (23)$$

$$\approx y_j + z_j \qquad (24)$$

where $z_j$ is the realization of the unobservable random variable Y that represents the photon energy in an interval of the discrete-time detector response, $$Y_j = \sum_{k \in [T_j, T_j+L]} R_k \qquad (25)$$

where $z_j$ is a realization of Z, an independent random variable representing errors in the sampling process and estimation of $T_j$. We assume Z has known variance $\sigma^2$. With these definitions of X and Y, the number of intervals which can be found in a finite length of detector output is a random variable N. At high count-rates this approach succumbs to paralysis, as the probability of being able to partition the observed data into intervals approaches zero. The onset of paralysis occurs at higher count-rates compared to pile-up rejection based strategies, since multiple photons are permitted to pile-up within in each interval. Assume the time-series defined in (3)-(6) has been sampled uniformly. Without loss of generality, assume unit sample intervals beginning at $t_0=0$ i.e., $t_k=k$, $0 \leq k < K$. Let R be a discrete-time random process representing the sampled detector response of (1). Let $Y=\{Y_j: 0 \leq j < N\}$ be a discrete-time random process whose components $Y_j$ represent the total photon energy arriving during a fixed time interval. A compound Poisson process can be used to model Y, i.e., $$Y_j = \begin{cases} \sum_{k=1}^{v_j} A_k, & v_j > 0 \\ 0 & v_j = 0 \end{cases} \quad (26)$$

$$v_j \sim Pn(\lambda) \quad (27)$$

where $v_j$ is an independent Poisson random variable, and $A_k$ are independent identically distributed random variables with density function $f_A(x)$. The $\{v_j\}$ form a homogeneous Poisson process with rate parameter $\lambda$. The process Y is not directly observable. Assume the pulse shape $\Phi(t)$ has finite support. Let $\mathbb{1}_A(t)$ be the indicator function for the set A. Let the pulse length $\ell$ be given by $\ell = \sup(\{t: \Phi > 0\}) - \inf(\{t: \Phi(t) > 0\})$. Let $S = R + W = \{s(k): 0 \leq k < K\}$ be a discrete-time random process representing the observed detector output given by (2). It consists of the detector response R corrupted by a noise process W. Without loss of generality, we assume unit sample intervals. From the observations S we form the process X, where $$X_j \triangleq Y_j + Z_j \quad (28)$$

and where $Z_j$ is a random variable from an independent noise process of known variance $\sigma^2$. A simple model for testing theory is obtained when we let the pulse shape $\Phi(t) = \mathbb{1}_{(0,1)}(t)$ in (1), in which case we let $X_j = S_j$, and N is simply the sample length K. Obtaining $X_j$ from S is more complicated for real data. In that case we partition the process S into non-overlapping blocks of length L, where $L > \ell$. The Poisson rate $\lambda$ is expressed in photons per block. The start of each block $T_j \in \mathbb{N}$ is chosen such that the total energy of any pulse is fully contained within the block in which it arrives $$T_j = \min\{k : R_k = 0, R_{k+L} = 0, T_{j-1} + L < k < K - L\} \quad (29)$$

FIG. 1 shows that $$Y_j = \sum_{k=T_j}^{T_j+L} R_k.$$

We let $$X_j = \sum_{k=\hat{T}_j}^{\hat{T}_j+L} S_k \quad (30)$$

where $\hat{T}_j$ is an estimate of $T_j$. Section 4.2 describes the selection of L and $\epsilon$ for real data. With this definition of $X_j$, the number of components in Y becomes a random variable for a given sample length K. At high count-rates this approach succumbs to paralysis, as the probability of being able to create a block approaches zero. The onset of paralysis occurs at higher count-rates compared to pile-up rejection based strategies, since multiple photons are permitted to pile-up within in each block. Let $Y = \{Y_j: 0 \leq j < N\}$ be a discrete-time random process whose components $Y_j$ are given by $$Y_j = \sum_{k=T_j}^{T_j+L} R_k \quad (31)$$

$$T_j = \min_{k > T_{j-1}+L}\{R_k < d, R_{k+L} < d\} \quad (32)$$

where $L \in \mathbb{N}$ is a constant chosen such that h and d is a small threshold value close to zero. The random variable $Y_j$ thus represents the total photon energy arriving during a fixed time interval of length L. The value of d ensures the signal associated with photon arrivals is very small at the start and end of each interval. This is illustrated in FIG. 1. A compound Poisson process can be used to model Y, i.e., $$Y_j = \begin{cases} \sum_{k=1}^{v_j} A_k, & v_j > 0 \\ 0 & v_j = 0 \end{cases} \quad (33)$$

$$v_\lambda = \{v_j : 0 \leq j < N\} \quad (34)$$

$$v_j \sim Pn(\lambda) \quad (35)$$

where $v_\lambda$ is a homogeneous Poisson process with rate parameter $\lambda$, and $A_k$ are independent identically distributed random variables with density function $f_A(x)$. Let $S = R + W$ be a discrete-time random process representing the sampled detector output given by (2). It consists of the detector response R corrupted by a noise process W. The process Y is not directly observable. Using (2), (25) and (32), we model observations by the process $X = \{X_j: 0 \leq j < N\}$, i.e., $$X_j = \sum_{k=T_j}^{T_j+L} S_k \quad (36)$$

$$= \sum_{k=T_j}^{T_j+L} (R_k + W_k) \quad (37)$$

$$= Y_j + \sum_{k=T_j}^{T_j+L} W_k \quad (38)$$

$$\triangleq Y_j + Z_j \quad (39)$$

where Z is a noise process of known variance $\sigma^2$. All the random variables $(v_j, A_1, \ldots, A_{v_j}, Z_j)$ involved in modelling a given observation $X_j$ are assumed independent. Let $X_1, X_2, \ldots, X_N$ be N independent, identically distributed observations. Let X, Y, Z, A be the collections of $X_j, Y_j, Z_j, A_j$: $0 \le j < N$. Let the corresponding characteristic functions be $\phi_X, \phi_Y, \phi_Z, \phi_A$.

3.3 Basic Form of Estimator

We seek to invert the mapping from the distribution of photon energy A to the distribution of X. Our strategy is to first obtain the characteristic function of X in terms of $f_A$, then invert the mapping assuming the count-rate and noise characteristics are known. Let $\phi_X, \phi_Y, \phi_Z, \phi_A$ be the characteristic functions of X, Y, Z, A. It is well known [15] that for the compound Poisson process Y with rate $\lambda$, $$\phi_Y(u) = e^{-\lambda} e^{\lambda \phi_A(u)} \quad (40)$$

and since X=Y+Z then $$\phi_X(u) = \phi_Y(u)\phi_Z(u). \quad (41)$$

Given the observations $x_j$ we can form an empirical estimate $\hat{\phi}_X$ of the characteristic function of X. Treating this as the true characteristic function, we can invert (40), (41) to obtain the characteristic function of A and then take the Fourier transform to find the amplitude spectrum $f_A$. Specifically, using (40), (41) and exploiting the assumption that Z is Gaussian to ensure $\phi_Z(u)$ will be non-zero $\forall u \in \mathbb{R}$, we let $\gamma: \mathbb{R} \to \mathbb{C}$ be the curve described by $$\gamma(u) = \frac{\phi_X(u)}{e^{-\lambda}\phi_Z(u)} \quad (42)$$

$$= e^{\lambda \phi_A(u)} \quad (43)$$

Temporarily assuming $\forall u, \gamma(u) \ne 0$, after taking the distinguished logarithm of (43) and rearranging we have $$\phi_A(u) = \frac{1}{\lambda} dlog(\gamma)(u). \quad (44)$$

Ideally, $f_A$ is recovered by taking a Fourier transform $$f_A(x) = \int_{-\infty}^{\infty} e^{-i2\pi u x} \phi_A(u)\, du \quad (45)$$

The basic form of our proposed estimator is given in (88) and is derived from (45) via a sequence of steps. First, $\phi_X$ is estimated from the data (Step 1). Simply substituting this estimate for $\phi_X$ in (42) does not produce an ISE optimal estimate of $\gamma$. The approximate ISE is obtained from an approximate estimate of the error distribution of $\phi_X$ (Step 2). We then determine a sensible windowing function $G(u)$ (in Step 3) and estimate $\gamma$ by $$\hat{\gamma}(u) = G(u)\frac{\hat{\phi}_X(u)}{e^{-\lambda}\phi_Z(u)}. \quad (46)$$

The windowing function $G(u)$ is designed to minimise the approximate ISE between $f_A$ and our estimate of $f_A$ based on (44), (45) and (46), but with $\gamma$ in (44) replaced by (46). A similar idea is used for estimating $\phi_A$ from (44): a weighting function $H(u)$ is found (in Step 4) such that replacing $\phi_A$ in (45) by $$\hat{\phi}_A(u) = H(u)\frac{1}{\lambda}dlog(\hat{\gamma}) \quad (47)$$

produces a better estimate of $f_A$ than using the unweighted estimate $1/\lambda d \log(\hat{\gamma})$. Finally, the weighting function $H(u)$ is modified (in Step 5) to account for the integral in (45) having to be replaced by a finite sum in practice. The following subsections expand on these five steps.

3.4 Estimating $\phi_X$

An estimate of $\phi_X(u)$ is required to estimate $\gamma(u)$. In this subsection we define a histogram model and describe our estimation of $\phi_X(u)$ based on a histogram of the $x_j$ values. Assume N intervals (and corresponding $x_j$ values) have been obtained from a finite length data sample. Although the empirical characteristic function $$\hat{\phi}_{X\,emp}(u) = \frac{1}{N}\sum_{j=0}^{N-1} e^{iux_j} \quad (48)$$

provides a consistent, asymptotically normal estimator of the characteristic function [21], it has the disadvantage of rapid growth in computational burden as the number of data points N and the required number of evaluation points $u \in \mathbb{R}$ increases. Instead, we use a histogram based estimator that has a lower computational burden. Assume that a histogram of the observed X values is represented by the $2M \times 1$ vector n, where the count in the mth bin is given by $$n_m = \sum_{k=0}^{N-1} \mathbb{1}_{[m-0.5, m+0.5)}(x_k),\ m \in \{-M, \ldots, M-1\}. \quad (49)$$

All bins of the histogram have equal width. The bin-width is chosen in relation to the magnitude of the $x_j$ values. Since the effect of choosing a different bin width is simply equivalent to scaling the $x_j$ values, we assume the bin-width to be unity without loss of generality. The bins are apportioned equally between non-negative and negative data values. The number of histogram bins 2M influences the estimator in various ways, as discussed in later subsections. For now, it is sufficient to assume that 2M is large enough to ensure the histogram includes all $x_j$ values. We estimate $\phi_X(u)$ by forming a histogram of scaled $x_j$ values and take the inverse Discrete Fourier transform i.e., $$\hat{\phi}_X(u) = \sum_{m=-M}^{M-1} \frac{n_m}{N} e^{i\frac{2\pi u m}{2M}}. \quad (50)$$

This is a close approximation of the empirical characteristic function but where $x_j$ terms have been rounded to the nearest histogram bin centre (and u contracted by a factor of $2\pi$). The term $n_m$ simply counts the number of rounded terms with the same value. Clearly, this function can be efficiently evaluated at certain discrete points $u \in -M, \ldots, M-1$ using the fast Fourier Transform (FFT).

3.5 Error Distribution of $\hat{\phi}_X$

The design of the filters G(u) and H(u) in (46) and (47) rely on the statistics of the errors between $\hat{\phi}_X$ and the true characteristic function. In this subsection we define and describe the characteristics of these errors. We assume the density function $f_X$ is sufficiently smooth (i.e., $|d^n f_X(u)/du^n| \leq C_n \in \mathbb{R}\ \forall n \in \mathbb{N}$) and that the width of the histogram bins are sufficiently small (relative to the standard deviation of the additive noise Z) such that the errors introduced by rounding $x_j$ values to the centre of each histogram bin are approximately uniformly distributed across each bin, have zero mean and are small relative to the peak spreading caused by Z. In other words, the source of error arising from the binning of $x_j$ values is considered negligible. Due to both the statistical nature of Poisson counting and the expected count in each bin being non-integer ($\mathbb{E}[n_m] \in \mathbb{R}_{\geq 0}$), discrepancies exist between the observed number of counts in any given histogram bin and the expected number of counts for that bin. We combine these two sources of error in our model and refer to it as 'histogram noise'. We emphasize that this noise is distinct from the additive noise Z modelled in (11), which causes peak spreading in the histogram. Let the probability that a realization of X falls in the m-th bin be $$px_m = Pr(m - 0.5 \leq X < m + 0.5) \tag{51}$$

Let the normalized histogram error $\epsilon_m$ in the m-th bin be the difference between the observed count $n_m$ and the expected count $\mathbb{E}[n_m] = Npx_m$ in the mth bin, relative to the total counts in the histogram N i.e., $$\epsilon_m = \frac{n_m - Npx_m}{N} \tag{52}$$

Using (50), (51) and (52) we have $$\hat{\phi}_X(u) = \sum_{m=-M}^{M-1} \frac{n_m}{N} e^{i\frac{2\pi um}{2M}} \tag{53}$$

$$= \sum_{m=-M}^{M-1} px_m e^{i\frac{2\pi um}{2M}} + \sum_{m=-M}^{M-1} \epsilon_m e^{i\frac{2\pi um}{2M}} \tag{54}$$

$$\approx \phi_X(u) + \phi_\epsilon(u) \tag{55}$$

If the histogram is modelled as a Poisson vector, show that $$\mathbb{E}[\epsilon_i] = 0 \tag{56}$$

$$\mathbb{E}[\epsilon_i \epsilon_j] = \begin{cases} \frac{px_j}{N} & i = j \\ 0 & i \neq j \end{cases} \tag{57}$$

$$\mathbb{E}[|\phi_\epsilon|^2] = \frac{1}{N}. \tag{58}$$

Since the characteristics of the histogram noise can be expressed in terms of the total number of observed intervals N, the impact of using observation data of finite length may be accounted for by incorporating this information into the design of G(u) and H(u).

3.6 Estimating $\gamma$

Having obtained $\hat{\phi}_X$, the next task is to estimate $\gamma$. Rather than substitute $\hat{\phi}_X(u)$ for $\phi_X(u)$ in (42), we instead use (46) as the estimator, which requires us to choose a windowing function G(u). In this subsection we attempt to find a function G(u) that is close to optimal. When the distribution of errors in $\hat{\phi}_X(u)$ are considered, the windowing function $G(u) = G_{opt}(u)$ that results in the lowest ISE estimator of the form given in (46) is $$G_{opt}(u) = \frac{1}{\sqrt{1 + \frac{e^{-2\lambda \Re\{\phi_A(u)\}}}{Ne^{-2\lambda}|\phi_Z(u)|^2}}} \tag{59}$$

where $\Re\{z\}$ denotes the real component of $z \in \mathbb{C}$. We cannot calculate $G_{opt}(u)$ since $\phi_A(u)$ is unknown, so instead we attempt to find an approximation. We let $$G(u) = \frac{1}{\sqrt{1 + \frac{1}{Ne^{-2\lambda}|\phi_Z|^2(u)}}}. \tag{60}$$

This is justified by considering the magnitude of the relative error between the functions $g_{opt}(u)$ and $g_1(u)$ where $$g_{opt}(u) = 1 + \frac{e^{-2\lambda \Re\{\phi_A(u)\}}}{Ne^{-2\lambda}|\phi_Z|^2(u)} \tag{61}$$

$$g_1(u) = 1 + \frac{1}{Ne^{-2\lambda}|\phi_Z|^2(u)}. \tag{62}$$

The magnitude of the relative error is given by $$\left|\frac{g_{opt} - g_1}{g_1}\right| = \left|\frac{e^{-2\lambda \Re\{\phi_A\}} - 1}{Ne^{-2\lambda}|\phi_Z|^2 + 1}\right|. \tag{63}$$

Since $\Re\{\phi_A\} \in [-1, 1]$, we see the right hand side of (63) is maximum when $\Re\{\phi_A(u)\} = -1$. The relative error is thus bound by $$\left|\frac{g_{opt} - g_1}{g_1}\right| \leq \frac{e^{2\lambda} - 1}{Ne^{-2\lambda}|\phi_Z|^2 + 1} \tag{64}$$

which justifies the approximation when $\lambda$ is small, or when $N|\phi_Z|^2(u) \gg e^{4\lambda}$. Furthermore, we note that the above bound is quite conservative. The distribution of photon energies in spectroscopic systems can typically be modelled as a sum of K Gaussian peaks, where the kth peak has location $\mu_k$ and scale $\sigma_k$ i.e., $$f_A(x) = \sum_{k=0}^{K-1} \alpha_k \frac{1}{\sqrt{2\pi}\,\sigma_k} e^{-\frac{(x-\mu_k)^2}{2\sigma_k^2}} \tag{65}$$

where $$\sum_{k=0}^{K-1} \alpha_k = 1. \tag{66}$$

Consequently, the characteristic function will have the form $$\phi_A(u) = \sum_{k=0}^{K-1} \alpha_k e^{-2\pi^2 \sigma_k^2 u^2} e^{i 2\pi \mu_k u}. \tag{67}$$

i.e., oscillations within an envelope that decays as $e^{-cu^2}$ for some c>0. The upper bound given by (64) is quite conservative since $|\Re\{\phi_A\}|>>1$ for most values of u. The approximation error will be significantly smaller at most evaluation points across the spectrum. Having chosen G(u), we can form an estimate of $\gamma$ using (46). The windowing function reduces the impact of histogram noise arising from the finite number of data samples. For large values of $Ne^{-2\lambda}|\phi_Z(u)|^2$, the impact of windowing is negligible and the estimator is essentially the same as using (42) directly. However, in the regions where $$\ln N < 2\lambda + 4\pi^2 \sigma^2 u^2 \tag{68}$$

the windowing becomes significant, and acts to bound our estimate of $\gamma$ i.e., Using the fact that the noise Z is Gaussian (so $\phi_Z(u) \in \mathbb{R}$ and hence $|\phi_Z|^2 = \phi_Z^2$), and since $e^{-2\lambda}>0$ we see that $$|\hat{\gamma}(u)| = \left| \frac{\hat{\phi}_X(u)}{e^{-\lambda}\phi_Z(u)} \frac{1}{\sqrt{1 + \frac{1}{Ne^{-2\lambda}|\phi_Z|^2(u)}}} \right|. \tag{69}$$

$$= \left| \hat{\phi}_X(u) \frac{1}{\sqrt{e^{-2\lambda}\phi_Z^2(u) + \left(\frac{\phi_Z^2(u)}{N|\phi_Z|^2(u)}\right)}} \right| < \tag{70}$$

$$\sqrt{N} \tag{71}$$

This ensures the argument to the distinguished logarithm in (47) remains finite even though $\lim_{u \to \infty} \phi_Z(u) = 0$.

3.7 Estimating $\hat{\phi}_A$

Once $\hat{\gamma}$ has been obtained, we proceed to estimate $\hat{\phi}_A$ using (47). This requires another windowing function H(u). In this subsection we find a function H(u) for estimating $\phi_A$ that is close to ISE optimal. We begin by defining a function $\psi(u)$ for notational convenience $$\psi(u) = \frac{1}{G(u)} e^{-\lambda} \phi_Z(u). \tag{72}$$

The ISE is minimized when $H(u)=H_{opt}(u)$, where the optimal filter $H_{opt}(u)$ is given by $$H_{opt}(u) = \frac{\phi_A(u)}{\hat{\phi}_A(u)} = \frac{\frac{1}{\lambda} d\log\left(\frac{\phi_X}{e^{-\lambda}\phi_Z}\right)(u)}{\frac{1}{\lambda} d\log\left(\frac{\phi_X + \phi_\epsilon}{\psi}\right)(u)} \tag{73}$$

$$= \frac{\phi_A(u)}{\phi_A(u) + \frac{1}{\lambda} d\log\left(\frac{\phi_X}{\phi_X}\right)(u) + \frac{1}{\lambda} d\log(G)(u)} \tag{74}$$

Again, we cannot calculate the optimal filter by using (73)-(74) since $\phi_X(u)$, $\phi_A(u)$ and $\phi_\epsilon(u)$ are unknown. We instead make the following observations to obtain an approximation of the ISE-optimal filter.

3.7.1 Initial Observations

The optimal filter remains close to unity as long as the estimated $\hat{\phi}_A(u)$ remains close to the true value of $\phi_A(u)$. This will invariably be the case for small values of u since $$\mathbb{E}[|\phi_\epsilon(u)|] \approx \sqrt{\frac{\pi}{4N}} \ll \tag{75}$$

$$|\phi_X(u)| \approx 1 \text{ for small } u \tag{76}$$

Furthermore, equation (73) shows that if $|\phi_\epsilon(u)| \le\le |\phi_X(u)|$, then $\hat{\phi}_X(u)=\phi_X(u)+\phi_\epsilon(u) \approx \phi_X(u)$ so $H_{opt}(u) \approx 1$. For larger values of u, when the magnitude of $|\phi_X(u)|$ becomes comparable to or less than $|\phi_\epsilon(u)|$, the estimator $$\hat{\phi}_A(u) = \frac{1}{\lambda} d\log((\phi_X + \phi_\epsilon)/\psi)(u)$$

is dominated by noise and no longer provides useful estimates of $\phi_A(u)$. In the extreme case $|\phi_X(u)| << \phi_\epsilon(u)|$ so $|\hat{\phi}_X(u)| \approx |\phi_\epsilon(u)|$ and hence $$\Re\{\hat{\phi}_A\} \approx \frac{1}{\lambda} \ln\left|\frac{\phi_\epsilon}{\psi}\right| \tag{77}$$

The window H(u) should exclude these regions from the estimate, as the bias introduced in doing so will be less than the variance of the unfiltered noise. Unfortunately the estimate of $\phi_A(u)$ can be severely degraded well before this boundary condition is reached, so (77) is not particularly helpful. A more useful method for detecting when noise begins to dominate is as follows.

3.7.2 Filter Design Function

Further manipulation of (67) shows that for typical spectroscopic systems, the magnitude of $\phi_A$ will have the form $$|\phi_A|^2(u) = \tag{78}$$

$$\sum_{k=0}^{K-1} \alpha_k^2 e^{-4\pi^2 \sigma_k^2 u^2} + \sum_{k=0}^{K-1} \sum_{\substack{j=0 \\ j \ne k}}^{K-1} \alpha_k \alpha_j \cos(2\pi(\mu_k - \mu_j)u) e^{-2\pi^2(\sigma_k^2 + \sigma_j^2)u^2}$$

i.e.; a mean component that decays according to the peak widths $\sigma_k$, and a more rapidly decaying oscillatory component that varies according to the location of the spectral peaks $\mu_k$. In designing the window H(u), we are interested in attenuating the regions in $|\hat{\phi}_A|$ where $|\phi_A|^2 \lesssim |\phi_\epsilon/\psi|^2$, i.e., where the signal power is less than the histogram noise that has been enhanced by the removal of $\phi_Z$ during the estimation of $\gamma$. To obtain an estimate of $|\phi_A|$, a low-pass, Gaussian shaped filter $H_{lpf}(u)$ is convolved with $|\hat{\phi}_A|$ to attenuate all but the slowly varying, large scale features of $|\hat{\phi}_A|$. We denote this $|\hat{\phi}_{Asmooth}|(u)$ $$|\hat{\phi}_{Asmooth}|(u) = \left|\frac{1}{\lambda}d\log(\hat{\gamma})(u)\right| \star H_{lpf}(u). \tag{79}$$

We see that $|\phi_\epsilon(u)|$ has a Rayleigh distribution with scale parameter $$\sigma_{Ray} = \frac{1}{\sqrt{2N}}.$$

Consequently $$\frac{1}{\lambda}\frac{|\phi_\epsilon(u)|}{\psi(u)} \sim \text{Rayleigh}\left(\sigma_{Ray} = \frac{1}{\lambda\psi(u)\sqrt{2N}}\right). \tag{80}$$

It is well known that the cumulative distribution function of a Rayleigh distributed random variable $X_{Ray}$ is given by $$F_{Ray}(x; \sigma_{Ray}) = Pr(X_{Ray} < x; \sigma_{Ray}) \tag{81}$$

$$= 1 - e^{-\frac{x^2}{2\sigma_{Ray}^2}}. \tag{82}$$

Hence, to assist with computing the window $H(u)$ we will make use of the function $$\alpha_{min}(u) = 1 - e^{-\frac{1}{2}|\hat{\phi}_{Asmooth}|(u)^2\lambda^2\psi(u)^2 2N} \tag{83}$$

$$\approx Pr\left(\frac{1}{\lambda}\frac{|\phi_\epsilon(u)|}{\psi(u)} < |\hat{\phi}_{Asmooth}|(u)\right) \tag{84}$$

to control the shape of $H(u)$. The function $\alpha_{min}(u)$ provides an indication of how confident we can be that the estimate $\hat{\phi}_A(u)$ contains more signal energy than noise energy. The approximation in (84) arises from the fact that $|\hat{\phi}_{Asmooth}|$ is also a random variable slightly affected by the noise $\epsilon$. On occasion—particularly for larger values of $|u|$—the histogram noise may result in sufficiently large values of $\alpha_{min}(u)$ to give a false sense of confidence, and potentially allow noisy results to corrupt the estimate of $\phi_A$. To overcome this problem, the function was modified to be uni-modal in u $$\alpha_{mod}(u) = \inf\{\alpha_{min}(v), |v| < |u|\} \tag{85}$$

This modification was justified on the assumption that Gaussian noise causes $\phi_Z(u)$ to be decreasing in $|u|$. Consequently we expect $\mathbb{E}[|\phi_\epsilon(u)|/\psi(u)]$ to be increasing in $|u|$. If we ignore the local oscillations in $\phi_A(u)$ that are due to peak locations in $f_A(x)$, the envelope approximated by the smoothed $|\hat{\phi}_{Asmooth}|(u)$ will be non-increasing in $|u|$. Equation (74) indicates the optimal window has the form $\lambda\phi_A(u)/(\lambda\phi_A(u)+d\log(\hat{\phi}_X/\phi_X)(u)+d\log(G)(u))$, so the overall window shape will be decreasing in $|u|$. Hence, if the estimated characteristic function in the region of some $u_0$ (where the signal to noise ratio is high) has determined that the window value should be $H(u_0)<1$, then it is reasonable to reject the suggestion that in the region $u_1>u_0$ (where the signal to noise ratio will be worse) that $H(u_1)>H(u_0)$. Using the knowledge that $|H_{opt}(u)|$ should be close to unity for small $|u|$, close to zero for large $|u|$, and should 'roll off' as the signal-to-noise-ratio decreases—we consider two potential windowing functions as approximations of $H_{opt}(u)$.

3.7.3 Rectangle Window

The indicator function provides a very simple windowing function $$H(u) = 1_{\{\alpha_{mod}(u) > \alpha_0\}}(u). \tag{86}$$

The threshold value $\alpha_0$ determines the point at which cut-off occurs, and can be selected manually as desired (e.g., $\alpha_0=0.95$). Once the threshold is chosen, the estimator exhibits similar ISE performance regardless of peak locations in the incident spectra. Rather than requiring the user to select a window width depending on the incident spectrum[1], the width of the window is automatically selected by the data via $\alpha_{mod}(u)$. While simplicity is the primary advantage of the rectangular window, the abrupt transition region provides a poor model for the roll-off region of the optimal filter. The second filter shape attempts to improve on that.

3.7.4 Logistic Window

A window based on the logistic function attempts to model smoother roll-off. It is given by $$H(u) = \frac{1 + e^{-\beta_0(1.0-\alpha_0)}}{1 + e^{-\beta_0(\alpha_{mod}(u)-\alpha_0)}} \tag{87}$$

where $\alpha_0$ again acts as a threshold of acceptance of the hypothesis that the signal energy is greater than the noise energy in the estimate $\hat{\phi}_A(u)$. The rate of filter roll off in the vicinity of the threshold region is controlled by $\beta_0>0$. This provides a smoother transition region than the rectangle window, reducing Gibbs oscillations in the final estimate of $\phi_A$. Once again, although the parameters $\alpha_0$, $\beta$ are chosen manually, they are much less dependent on $\phi_A$ and can be used to provide close to optimal filtering for a wide variety of incident spectra. Typical values used were $\alpha_0=0.95$, $\beta_0=40.0$. The performance of the rectangle and logistic window functions are compared in section 4.

3.8 Estimating $f_A$

Having designed a window function $H(u)$ and thus an estimator $\hat{\phi}_A(u)$, the final task is to estimate $f_A(x)$ by inverting the Fourier transform. This sub-section describes several issues that arise with numerical implementation. Firstly, it is infeasible to evaluate $\hat{\phi}_X$, $\hat{\gamma}(u)$ and $\hat{\phi}_A$ numerically on the whole real line. Instead we estimate it at discrete points over a finite interval. The finite interval is chosen sufficiently large such that a tolerably small error is incurred as a result of excluding signal values outside the interval. This is justified for $f_A(x)$ being a Gaussian mixture, since the magnitudes of $\phi_X$ and $\phi_A$ will decay as $e^{-cu^2}$ for some $c>0$. The Fast Fourier Transform (FFT) is used to evaluate $\hat{\phi}_X$ at discrete points, and hence also determines the points where $\hat{\gamma}(u)$ and $\hat{\phi}_A$ are evaluated. Likewise, the FFT is used to evaluate the final estimate of $\hat{f}_A$ at discrete points. In order to use the FFT, the signals outside the interval should be sufficiently small to reduce impact of aliasing. The evaluation points also need to be sufficiently dense to avoid any 'phase wrap' ambiguity when evaluating $d \log(\hat{\gamma})(u)$. Both these objectives can be achieved by increasing the number of bins 2M in the histogram (zero-padding) until a sufficiently large number of bins is attained. As M increases, the sampling density of $\hat{\gamma}$ increases, which allows phase wrapping to be detected and managed. A larger M also allows aliasing (caused by the Gaussian shaped tails of $|\phi_X|$) to be negligible. Typically a value of M was chosen as the smallest power of two sufficiently large such that the non-zero values of the histogram were confined to the 'lower half' indexes i.e., $M=\min\{M: n_m=0, |m|\in\{M/2, \ldots, M\}, M=2^N, N\in\mathbb{N}\}$. Secondly, the distinguished logarithm in (47) is undefined if $\hat{\gamma}(u)=0$. In estimating $\gamma(u)$ from the data, there is a small but non-zero probability that the estimate will be zero. In this case, the distinguished logarithm in (47) is undefined and the technique fails. As $|u|$ increases, $|\phi_X|(u)$ decreases and may approach $|\phi_\epsilon|(u)$. When $|\phi_X|(u)$ and $|\phi_\epsilon|(u)$ have similar magnitudes, the probability of $|\phi_X+\phi_\epsilon|$ (and hence $\hat{\gamma}$) being close to zero can become significant. The filter $H(u)$ should roll off faster than $|\phi_X|(u)$ approaches $|\phi_\epsilon|(u)$ to reduce the impact this may have on the estimate. Ideally $H(u)$ should be zero in regions where noise may result in $|\hat{\gamma}|(u)$ being close to zero. Gugushvili has shown [18] that for a rectangular window, the probability of inversion failure approaches zero as the length of the data set increases $N\rightarrow\infty$.

3.9 Discrete Notation

We digress momentarily to introduce additional notation. Throughout the rest of the paper, bold font will be used to indicate a 2M×1 vector corresponding to a discretely sampled version of the named function, e.g., $\hat{\phi}_A$ represents a 2M×1 vector whose values are given by the characteristic function $\hat{\phi}_A(u)$ evaluated at the points $u\in\{0, 1, \ldots, M-1, -M, \ldots, -2, -1\}$. Square bracket notation [k] is used to index a particular element in the vector, e.g., $\hat{\phi}_A[M-1]$ has the value of $\hat{\phi}_A(M-1)$. We also use negative indexes for accessing elements of a vector in a manner similar to the python programming language. Negative indexes should be interpreted relative to the length of the vector, i.e., $\hat{\phi}_A[-1]$ refers to the last element in the vector (which is equivalent to $\hat{\phi}_A[2M-1]$).

3.10 Summary of Estimator

The estimation procedure we use may be summarized in the following steps.
1. Partition sampled time series into intervals using (8).
2. Calculate $x_j$ value for each interval according to (9).
3. Generate histogram n from the $x_j$ values.
4. Calculate $\hat{\phi}_X$ using the inverse FFT to efficiently evaluate (50) at various sample points.
5. Calculate $\phi_Z$ and G at the appropriate points.
6. Calculate $\hat{\gamma}$ via (46) using $\hat{\phi}_X$, G and $\phi_Z$.
7. Calculate $|\phi_{Asmooth}(u)|$, a low-pass filtered version of $$\left|\frac{1}{\lambda}d\log(\hat{\gamma})(u)\right|.$$

8. Calculate $\alpha_{mod}$ via (83) and (85).
9. Calculate H using $\alpha_{mod}$ and either (86) or (87).
10. Calculate $\hat{\phi}_A$ via (47) using $\hat{\gamma}$ and H. If any element of $\hat{\gamma}$ is zero and the corresponding element of H is non-zero, the estimation has failed as the distinguished logarithm is undefined.

11. Calculate $\hat{f}_A$ using the FFT of $\hat{\phi}_A$ according to $$\hat{f}_A[k] = \frac{1}{2M}\sum_{m=-M}^{M-1}\hat{\phi}_A[m]e^{-\frac{i2\pi mk}{2M}}. \tag{88}$$

3.11 Performance Measures

The performance of the estimator is measured using the integrated square of the error (ISE). The ISE measures the global fit of the estimated density.

$$ISE(\hat{f}_A, f_A) = \int_{-\infty}^{\infty}(\hat{f}_A(x) - f_A(x))^2 dx \tag{89}$$

The discrete ISE measure is given by $$ISE(\hat{p}_A, p_A) = \sum_{m=-M}^{M-1}(\hat{p}_A[m] - p_A[m])^2 \tag{90}$$

where $p_A$ is a 2M×1 vector whose elements contain the probability mass in the region of each histogram bin i.e., $$p_A[m] = \int_{m-0.5}^{m+0.5}f_A(x)dx. \tag{91}$$

The vector $\hat{p}_A$ represents the corresponding estimated probability mass vector.

4 NUMERICAL RESULTS OF THE FIRST EMBODIMENT

Experiments were performed using simulated and real data.

4.1 Simulations

The ideal density used by Trigano et al. [11] was used for these simulations. It consists of a mixture of six Gaussian and one gamma distribution to simulate Compton background. The mixture density is given by $$f \propto 0.5g + 10\mathcal{N}(40, 1) + 10\mathcal{N}(112, 1) + \tag{92}$$
$$1\mathcal{N}(50, 2) + 1\mathcal{N}(63, 1) + 2\mathcal{N}(140, 1)$$

where $\mathcal{N}(\mu, \sigma^2)$ is the density of a normal distribution with mean $\mu$ and variance $\sigma^2$. The density of the gamma distribution is given by $g(x)=(0.5+x/200)e^{-(0.5+x/200)}$. The density was sampled at 8192 equally spaced integer points to produce the discrete vector $p_A$ of probability mass. The FFT was taken to obtain $\phi_A$, a sampled vector of $\phi_A$ values.

A particular count rate $\lambda$ was chosen for an experiment, corresponding to the expected number of events per observation interval. The expected pile-up density was obtained via (40). i.e., the discrete vector $\phi_A$ was scaled by $\lambda$, exponentiated, then scaled by $e^{-\lambda}$ and finally an FFT was applied $$p_Y[m] = FFT(e^{-\lambda}e^{\lambda\phi_A})[m]. \tag{93}$$

Equation (93) was convolved with a Gaussian to simulate the effect of noise Z smearing out the observed spectrum $$p_X = p_Y \star \frac{1}{\sqrt{2\pi}\,\sigma} e^{-\frac{m^2}{2\sigma^2}}. \quad (94)$$

This represents the expected density of the observed spectrum, including pile-up and additive noise. Observation histograms were created using random variables that were distributed according to (94). Experiments were parameterized by the pair (N, λ) where N∈{$10^4$, $10^5$, $10^6$, $10^7$, $10^8$, $10^9$} and λ∈{1.0, 3.0, 5.0}. For each parameter pair (N, λ), one thousand observed histograms were made. Estimates of the probability mass vector $p_A$ were made using (88) with both (86) and (87) used for H(k). A threshold value of $\alpha_0$=0.95 was used for both window shapes, and $\beta_0$=40.0 for the logistic shape. The discrete ISE measure of the error between each estimate $\hat{p}_A$ and the true vector $p_A$ were recorded. For comparison with asymptotic bandwidth results, estimates were made using a rectangular window whose bandwidth was selected according to the condition 1.3 specified by Gugushvili in [18] i.e., $h_N$=(ln N)$^{-\beta}$ where β<½. We emphasize that the β of Gugushvili's filter is not to be confused with the $\beta_0$ of (87). The asymptotic bandwidth criterion was implemented by using $$H[k] = 1_{\{|k|<\alpha_0\}}[k] \quad (95)$$

$$\text{where } \alpha_0 = \frac{M}{\pi}(\ln N)^\beta. \quad (96)$$

Three values for Gugushvilli's β were trialed, namely β=½, ⅓, ¼.

Figure 2:
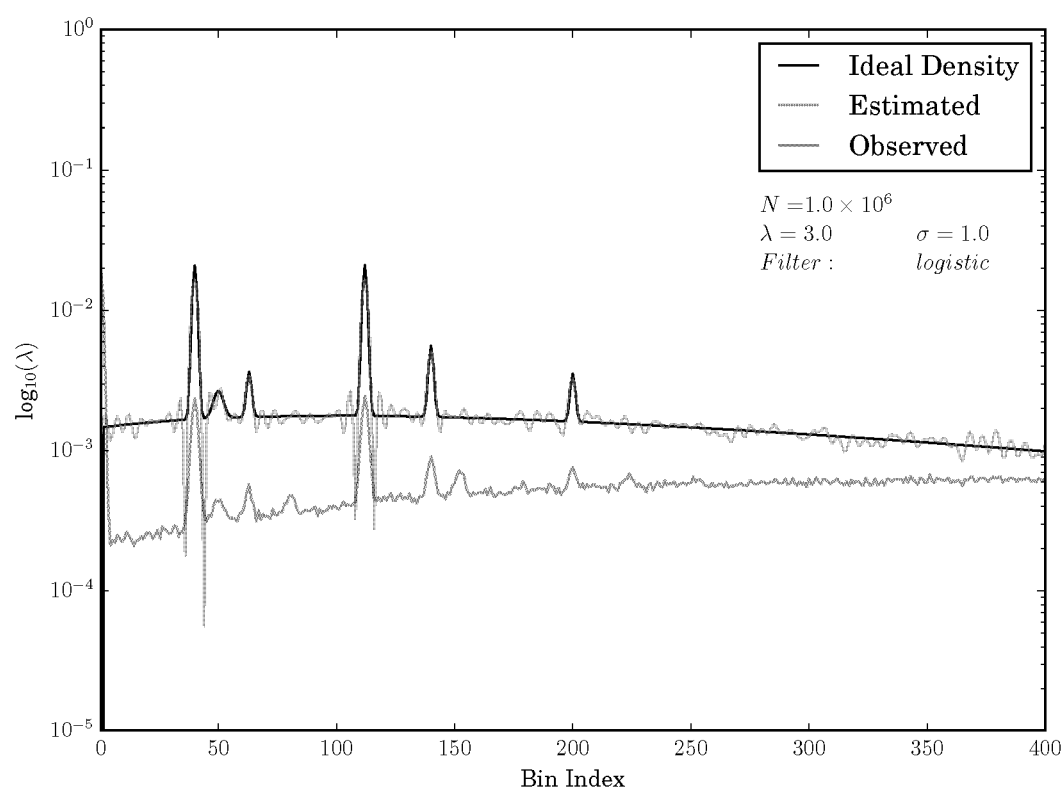
FIG. 2 plots a typical estimate made by the data-driven logistic shaped filter for an experiment with a parameter pair.
Figure 3:
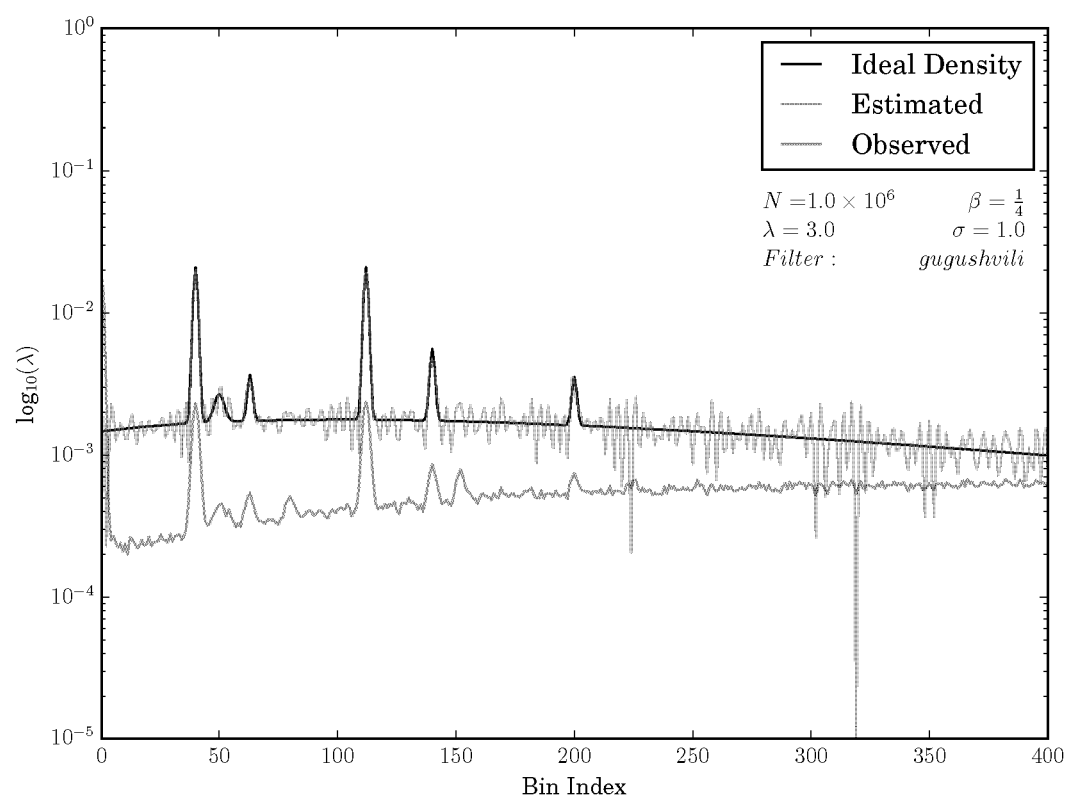
FIG. 3 plots a typical estimate made at the same operating point as FIG. 2, but with an estimator having a rectangular filter and a selected bandwidth.
Figure 4:
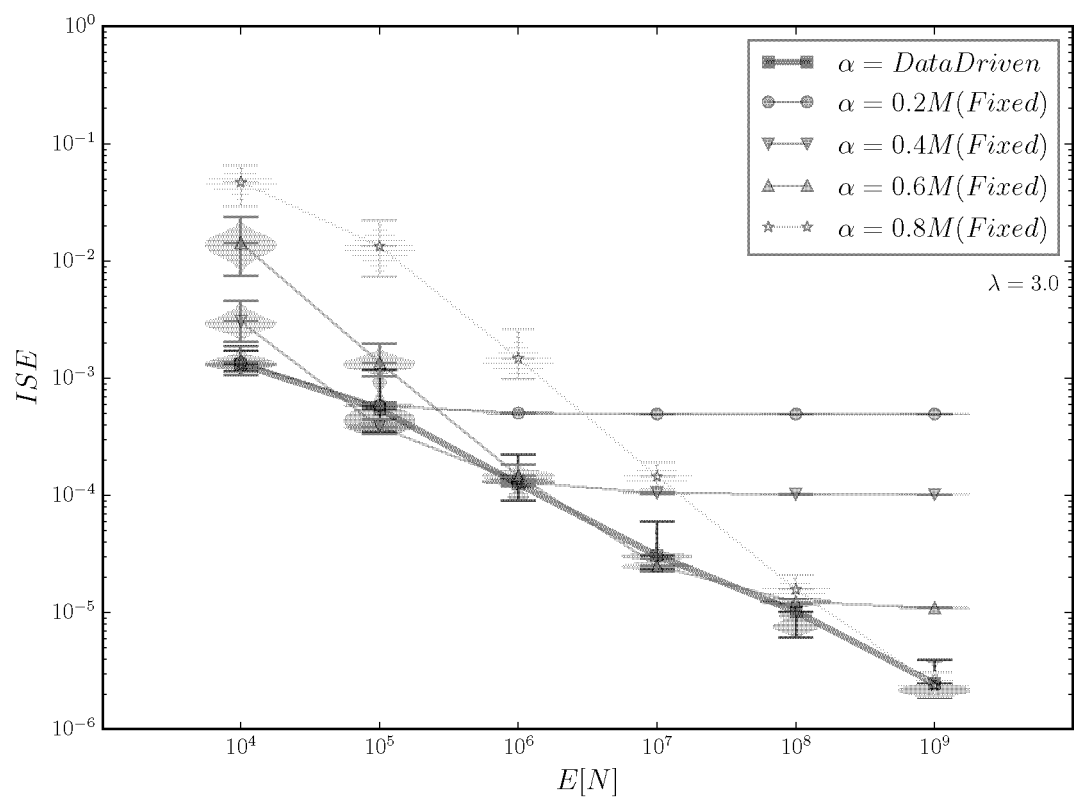
FIG. 4 shows the distribution densities of the integrated square of the error (ISE) measures as a function of sample count using a rectangular filter and various fixed bandwidths.
Figure 5:
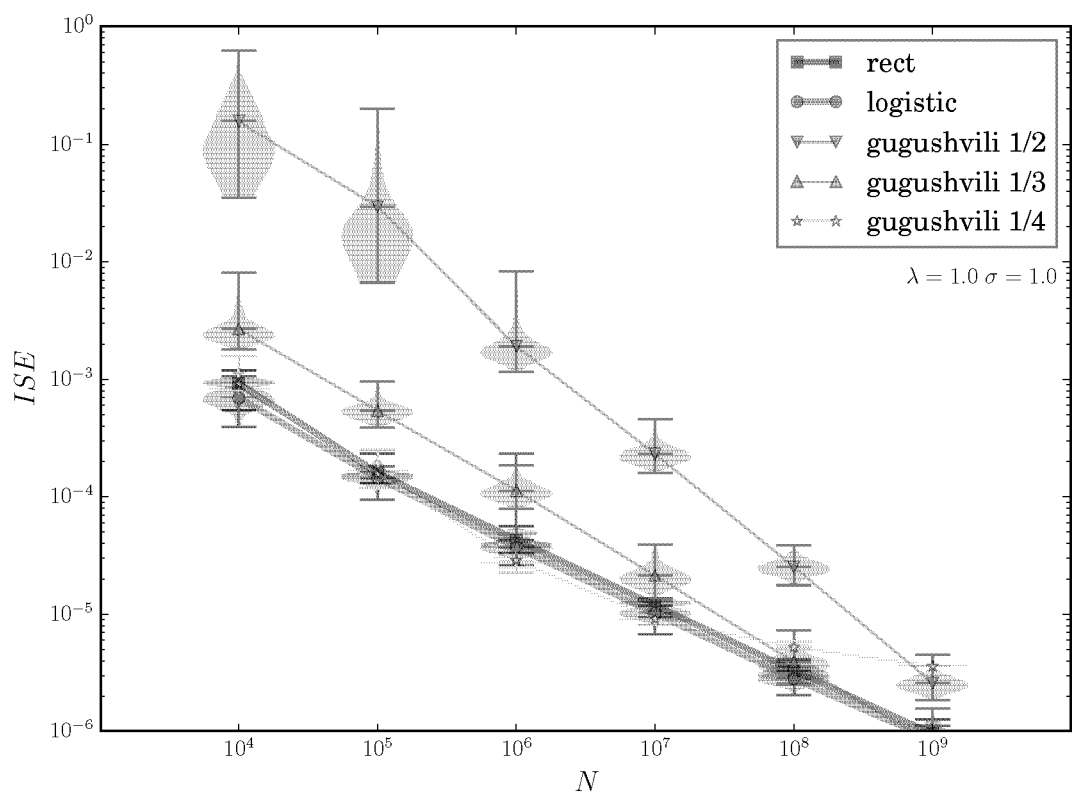
FIG. 5 shows the distribution densities of the ISE measure as a function of the total number of estimates N in each histogram at a first count rate.
Figure 6:
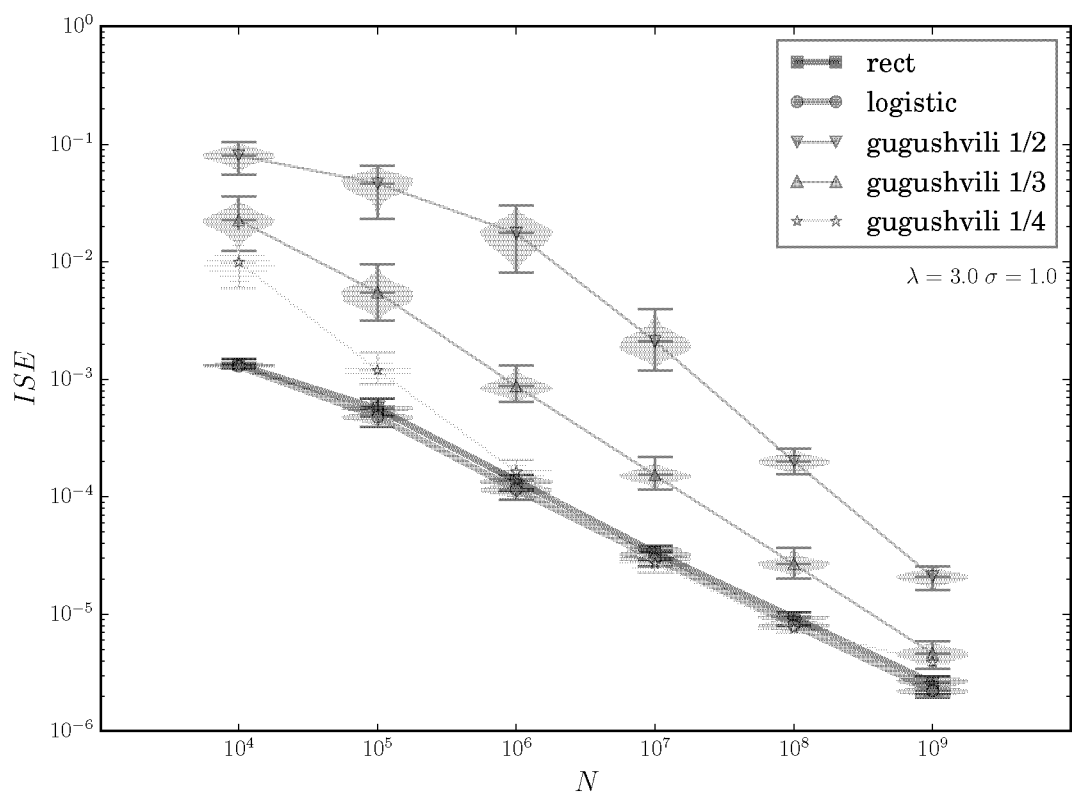
FIG. 6 shows the distribution densities of the ISE measure as a function of the total number of estimates N in each histogram at a second count rate.
Figure 7:
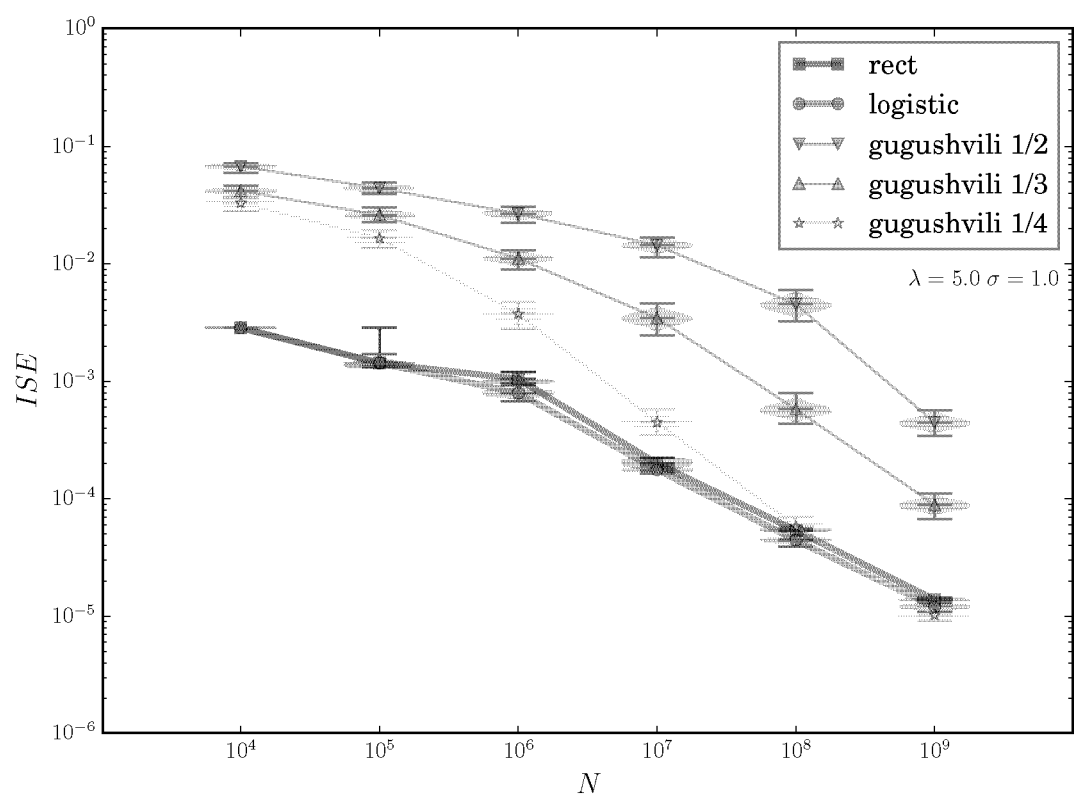
FIG. 7 shows the distribution densities of the ISE measure as a function of the total number of estimates N in each histogram at a third count rate.

Estimates were also made using a rectangular filter (95) with fixed bandwidths of various values α/M∈[0.2, 0.4, 0.6, 0.8]. Finally time-series data was created according to (1) with an idealised rectangular pulse shape and $10^7$ pulses whose energies were distributed according to (92). The pulse length and count rate were chosen to give a Poisson rate Δ=1.0. The algorithm described by Trigano et al. [11] was used to estimate the underlying amplitude density from a bi-dimensional histogram containing 32×1024 (duration×energy) bins—this choice of bins reportedly giving the best accuracy and reasonable execution times. The performance and processing time of the core algorithm were recorded for comparison with our proposed algorithm. FIG. 2 plots a typical estimate $\hat{p}_A$ made by the data-driven logistic shaped filter for an experiment with parameter pair (N=$10^6$, λ=3.0). The true vector $p_A$ (thin solid line), and the observed histogram $\hat{p}_X$ (lower curve containing some noise) are also plotted. Pile-up peaks can be clearly seen in the observed histogram. Although the estimated density suffers from ringing (due to the Gibbs phenomenon), it otherwise estimates the true density and corrects the pile-up that was present in the observed histogram. FIG. 3 plots a typical estimate made at the same operating point as FIG. 2, but with an estimator having a rectangular filter where the bandwidth was selected using (96) and β=¼. This corresponds to the operating region in FIG. 6 where the performance of the fixed bandwidth filter (β=¼) is approaching that of the data-driven filters. It is evident that while also correcting pile-up, the resulting estimate contains more noise. FIG. 4 shows the distribution densities of ISE measures as a function of sample count using a rectangular filter and various fixed bandwidths. Lines were plotted between distribution means (MISE) to assist visualization. The results for the data-driven rectangular filter (86) were also plotted, connected with a thicker curve. This clearly illustrates the weakness of fixed bandwidth filtering. For any fixed bandwidth, the ISE decreases as sample count increases, eventually asymptoting as the bias becomes the dominant source of error. At that point (which is noise and bandwidth dependent) the ISE remains largely constant despite increases in sample count. The fixed bandwidth excludes the use of some estimates $\hat{\phi}_A[k]$ in the final calculation, even when they have high signal-to-noise-ratio (SNR). FIG. 4 also shows the results given by the rectangular filter with our proposed data-driven bandwidth selection. This curve lies close to the inflection point of each fixed bandwidth curve. This indicates the bandwidth selected for the data-driven rectangular filter is close to the optimal bandwidth value (for a rectangular filter) across the range of sample counts. FIG. 5-FIG. 7 show the distribution densities of the ISE measure as a function of the total number of estimates N in each histogram at three count rates λ∈{1.0, 3.0, 5.0}. The MISE curves for the logistic and rectangular filters are lower than those obtained using the bandwidth given by (96) for much of the region of application interest. There are various regions where the non-data-driven bandwidth (β=¼) gives similar performance to the data-driven bandwidths, however this is not maintained across the whole range of sample counts. The logistic filter shape has slightly better performance than the rectangular filter shape, although the differences between the two filters appears relatively minor to the ISE measure. Table 1 compares the results between the proposed algorithm and the algorithm recently described in [11]. The ISE for both methods were similar at the operating point under test (λ=1.0, N=$10^7$), however our proposed algorithm requires considerably less computation.

TABLE 1

Comparison With Algorithm Described in [11]

| Algorithm | Avg. ISE | Avg. Time (sec) |
|---|---|---|
| Fast Trigano Algorithm 32 × 1024 (duration × energy) bins | 1.3 × $10^{-5}$ | 3.19 |
| Proposed Algorithm | 1 × $10^{-5}$ | 0.019 |

4.2 Real Data

Figure 8:
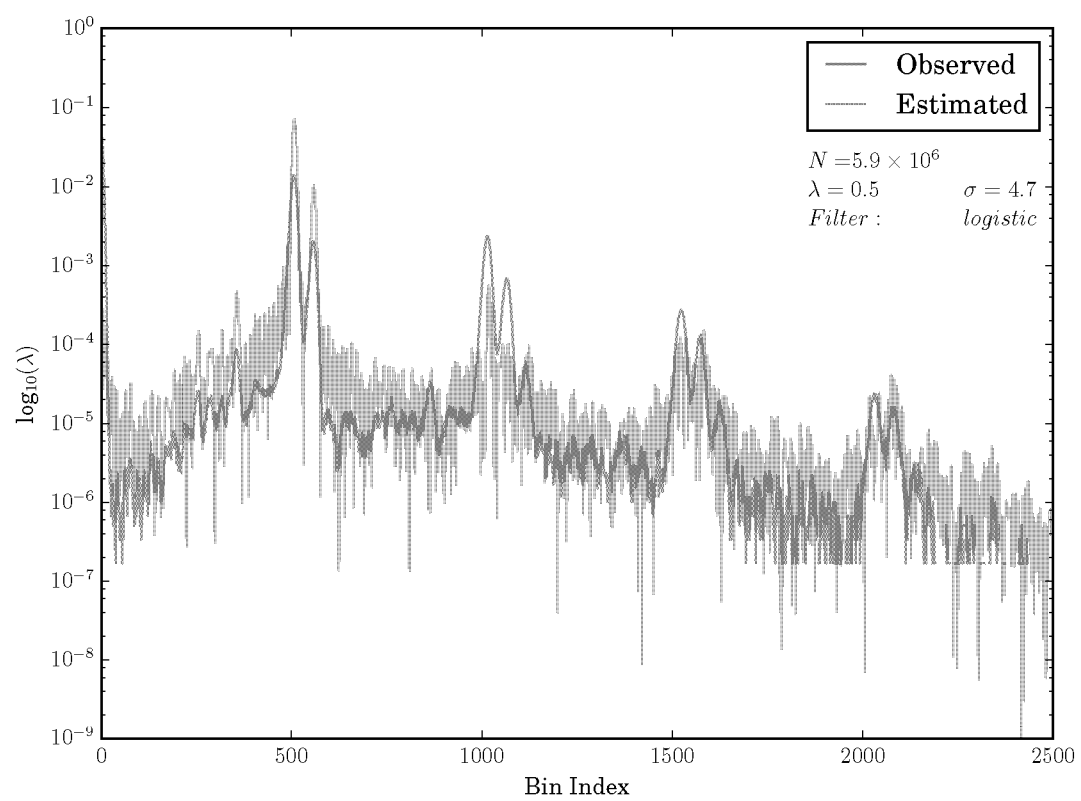
FIG. 8 shows plots of the observed and estimated probability mass vectors.

The estimator was applied to real data to assess its usefulness in practical applications. The threshold value ϵ found in (8) was chosen to be approximately one half the standard deviation of the additive noise w(t). This ensured a reasonably high probability of creating intervals, yet ensured errors in the estimation of interval energy were low. A value for the interval length L was chosen approximately four times the 'length' of a typical pulse—that is, four times the length of the interval {t: Φ(t)>ϵ}. An energy histogram was obtained from a manganese sample, with a photon flux rate of nominally $10^5$ events per second. A slight negative skew was present in the shape of the main peaks of the observed histogram, suggesting a complicated noise source had influenced the system. This is barely visible in FIG. 8. The noise was modelled as a bimodal Gaussian mixture rather than a single Gaussian peak. A simple least-squares optimization routine was used to fit bimodal Gaussian parameters $Z \sim \alpha_1 \mathcal{N}(\mu_1, \sigma_1^2) + \alpha_2 \mathcal{N}(\mu_2, \sigma_2^2)$ to the noise peak located around bin index zero. A suitable value for $\lambda$ was chosen manually. The logistic filter with data-driven bandwidth was used to estimate the true density. FIG. 8 shows plots of the observed and estimated probability mass vectors. The main peaks (bins 450~600) have been enhanced while the pile-up has been attenuated though not fully removed. The first order pile-up peaks have been reduced. The peak-to-pile-up ratio (ratio of the height of main peak to that of first pile-up peak) has increased from around 6 to around 120. These improvements are comparable to other state of the art systems (e.g., [11]). There are several possible reasons the estimator fails to fully resolve pile-up. The accuracy of the estimator depends on correctly modelling the Gaussian noise peak. The bimodal Gaussian mixture modelled the noise peak such that the maximum error was less than 1% of the noise density peak. Given that the residual pile-up peaks in the estimated spectrum are below 1% of the main peak, the sensitivity of the estimator to errors in noise modelling may have contributed to this in some part. A second reason for the unresolved pile-up may be due to the uncertainty in the estimation of the observed spectrum. Several of the residual pile-up peaks are relatively close to the floor of the observed histogram. The residual peaks may simply be a noise induced artefact of the estimator. Finally, the mathematical model may be an overly simple approximation of the observed spectrum. The detection process includes numerous second-order effects that have not been included in the model (e.g., ballistic deficit, supply charge depletion, correlated noise, non-linearities, etc. . . . ). These minor effects may limit the accuracy of the pile-up correction estimator.

5 SUMMARY OF THE FIRST EMBODIMENT

We have taken the estimator proposed by Gugushvili [18] for decompounding under Gaussian noise, and adapted it for correcting pulse pile-up in X-ray spectroscopy. We have proposed a data-driven bandwidth selection mechanism that is easily implemented, and provides significant reduction in ISE/MISE across a broad range of sample counts of interest to spectroscopic applications ($10^4$~$10^9$ counts). The data-driven rectangular bandwidth selection is close to optimal (for rectangular filters), and over the range of interest outperforms bandwidth selection based on asymptotic results or fixed bandwidth.

Although initial results appear promising, further work is required to improve the performance for practical implementations. The estimation still contains 'ringing' artefacts associated with the Gibbs phenomenon. Additional filter shape attempts to reduce this, there are other shapes that are closer to MSE optimal.

6 SECOND EMBODIMENT

This section gives a summary of the spectrum estimator of the 2nd embodiment. The 2nd embodiment solves the problem of the 1st embodiment which requires entire clusters to be approximately encompassed in each interval. In the 2nd embodiment, the entire data series if desired can be used, and the overlap is compensated by introduction of 2 different interval lengths L and L1.

We need to include a few additional terms not mentioned in the first embodiment. In particular $\hat{\phi}_{X1}$. The spectrum estimator is based on $$\hat{f}_A(x) = \frac{1}{2\pi\lambda} \int_{-\infty}^{\infty} e^{-iux} H(u) d\log(\gamma)(u) du. \tag{97}$$

The introduction of the filter H(u; α) allows us to address several implementation issues that arise. The estimation procedure we use may be summarized in the following steps.

1. Partition sampled time-series into fixed length intervals $[T_j, T_j+L)$, $j \in \mathbb{N}$
2. Calculate $x_j$ value for each interval according to $x_j = \Sigma_{k \in [T_j, T_j+L)} s(k)$.
3. Generate histogram n from the $x_j$ values.
4. Calculate $\hat{\phi}_X$ using the inverse FFT of n.
5. Partition the sampled time series into a different set of intervals with length $L_1$, and following similar calculations to obtain $\hat{\phi}_{X1}$.
6. Calculate $\phi_Z$ and G.
7. Calculate $\hat{\gamma}$ using $\hat{\phi}_X$, G, $\phi_Z$ and $\hat{\phi}_{X1}$, $$\hat{\gamma} = \frac{\hat{\phi}_X}{\phi_Z e^{-\lambda} \hat{\phi}_{X1}} \tag{98}$$

8. Calculate $|\phi_{Asmooth}(u)|$, a low-pass filtered version of $$\left| \frac{1}{\lambda} d\log(\hat{\gamma})(u) \right|.$$

9. Calculate $\alpha_{mod}$.
10. Calculate H using $\alpha_{mod}$.
11. Calculate $\hat{\phi}_A$ using $\hat{\gamma}$ and H. If any element of $\hat{\gamma}$ is zero and the corresponding element of H is non-zero, the estimation has failed as the distinguished logarithm is undefined.
12. Calculate $\hat{f}_A$ using the FFT of $\hat{\phi}_A$ according to $$\hat{f}_A[k] = \frac{1}{2M} \sum_{m=-M}^{M-1} \hat{\phi}_A[m] e^{-\frac{i2\pi mk}{2M}}. \tag{99}$$

6.1 Algorithm Details

Partition the detector output stream into a set of non-overlapping intervals of length L i.e., $[T_j, T_j+L)$, $T_0 \in \mathbb{Z}_{\geq 0}$, $T_{j+1} \geq T_j+L$, $j \in \mathbb{Z}_{\geq 0}$. Let $x_j$ be the sum of the detector output samples in the jth interval i.e., $\mathbb{Z}$ $$x_j = \sum_{k=T_j}^{T_j+L-1} s(k) \tag{100}$$

Assuming L is greater than a pulse length, the jth interval may contain 'complete' pulses as well as pulses which have been truncated by the ends of the interval. It can be shown that $x_j$ consists of a superposition of the energy of 'complete' pulses which we denote $y_j$, the energies of truncated pulses which we denote with $y_{1j}$ and noise $z_j$ Let the detector output stream be partitioned into a second set of non-overlapping intervals $[T_{1j}, T_{1j}+L_1)$, $T_{1,0} \in \mathbb{Z}_{\geq 0}$, $T_{1,j+1} \geq T_{1,j}+L$, $j \in \mathbb{Z}_{\geq 0}$ where $L_1 < L$. Let $x_{1j}$ be given by $$x_{1,j} = \sum_{k=T_{1,j}}^{T_{1,j}+L_1-1} s(k) \qquad (101)$$

If $L_1$ is chosen to be slightly less than the pulse length, the $x_{1,j}$ term will contain no 'complete' pulses, but consist of a superposition of only the energies of truncated pulses $y_{1,j}$ and noise $z_j$. The number of truncated pulses in any interval has a Poisson distribution. We have $$X_1 = Y_1 + Z_1, \qquad (102)$$

$$\phi_{X_1} = \phi_{Y_1}\phi_{Z_1}. \qquad (103)$$

We can decompose the total energy in the interval $[T_j, T_j+L)$ into the energy contribution $Y_1$ from pulses that have been truncated and the energy contribution $Y_0$ from pulses that are fully contained in the interval $[T_j, T_j+L)$ i.e., $$X = Y_0 + Y_1 + Z_0 + Z_1 \qquad (104)$$

where $Z_0$ represents noise in the regions where pulses are fully contained in the interval (a length of $L-L_1$), and $Z_1$ represents noise in the regions where pulses are truncated (a length of $L_1$). Hence, $$\phi_X = \phi_{Y_0}\phi_{Y_1}\phi_{Z_0}\phi_{Z_1}. \qquad (105)$$

By combining (103) with (105) we have $$\phi_X = \phi_{X_1}\phi_{Y_0}\phi_{Z_0} \qquad (106)$$

Rearranging gives $$\phi_{Y_0} = \frac{\phi_X}{\phi_{X_1}\phi_{Z_0}} \qquad (107)$$

$$= e^{-\lambda_0}e^{\lambda_0\phi_A(u)} \qquad (108)$$

We can estimate $\phi_{X_1}$ in a similar manner that we estimated $\phi_X$ or some other method, e.g., via the empirical characteristic function or by performing an FFT on the normalized histogram of $x_{1,j}$ values.

When performing the decompounding operation, the Poisson rate $\lambda_0$ for the reduced interval length $L-L_1$ is used to account for the sub-interval over which the compound Poisson process $Y_0$ occurs.

6.2 Visualization of Internal Quantities

Figure 9:
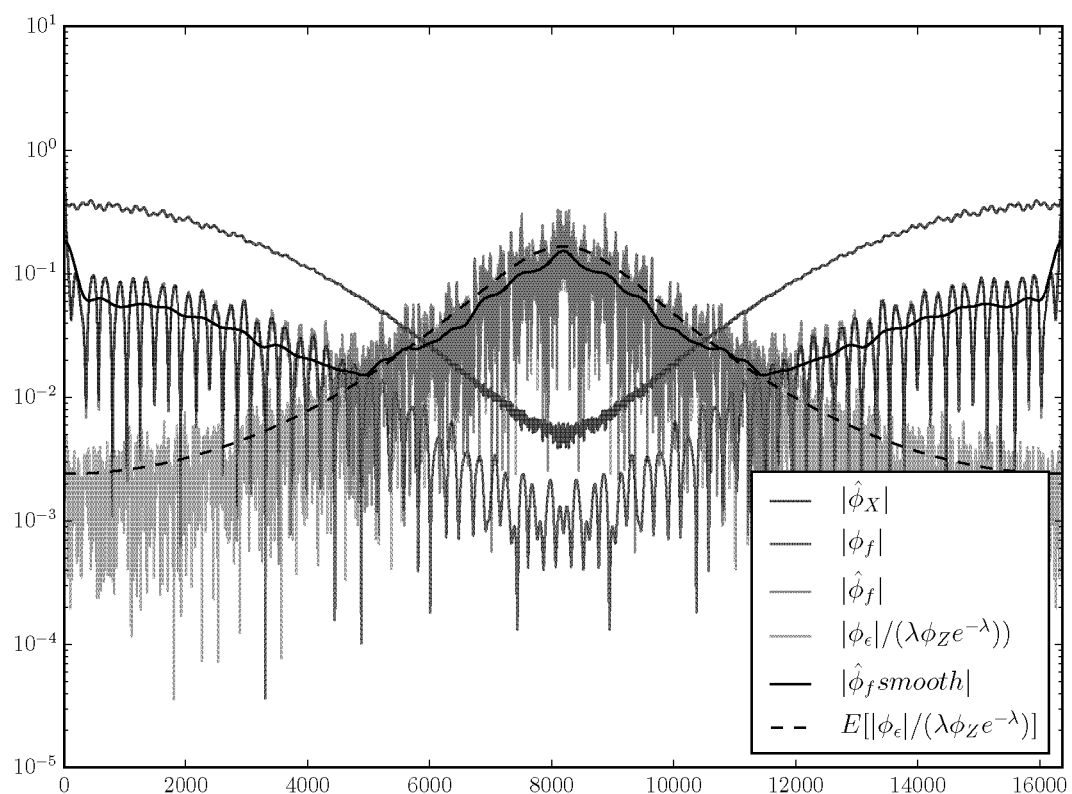
FIG. 9 plots various quantities obtained during the estimation process.

To aid the reader's understanding, FIG. 9 plots various quantities obtained during the estimation process. The upper blue curve (with a value around 0.3 at bin zero) plots $|\phi_{X_1}|$, the estimated characteristic function of the observed spectrum. A brown curve is used to show the true value of $|\phi_f|$, which is distinctly visible as the lower curve with periodic nulls in the region [6000, 10000]. The quantity $|\phi_\epsilon|/(\lambda\phi_Z e^{-\lambda})$ is shown in transparent red and appears as 'noise' whose average density peaks around bin #8000. The expected value of $|\phi_\epsilon|/(\lambda\phi_Z e^{-\lambda})$ is shown with a black dashed line. This is obtained using (75), the known value of $\lambda$, and assuming Gaussian noise with known $\sigma$ to obtain $\phi_Z(k)$. The quantity $|\hat{\phi}_f|$ is shown with a transparent blue curve. This is barely visible as it coincides closely with $|\phi_f|$ in the intervals [0, 4000], [12000, 16000], and closely with $|\phi_\epsilon|/(\lambda\phi_Z e^{-\lambda})$ in the interval [5000, 11000]. Note that the colour of $|\phi_\epsilon|/(\lambda\phi_Z e^{-\lambda})$ appears to change from red to purple in the interval [5000, 11000] as both transparent plots overlap. A solid black line shows $|\hat{\phi}_{fsmooth}|$, a low pass filtered version of $|\hat{\phi}_f|$. The low pass filtering removes any local oscillations in $|\hat{\phi}_f(k)|$ due to the peak localities, as described in paragraph on smoothing at the beginning of this section. The term $|\hat{\phi}_{fsmooth}(k)|$ serves as an estimate of $\mathbb{E}[|\phi_f(k)|]$. It can be see that $|\phi_f|$ provides a reasonably good estimate of $|\phi_f|$ in the region where $|\hat{\phi}_{fsmooth}| \gg \mathbb{E}[|\phi_\epsilon|/(\lambda\phi_Z e^{-\lambda})]$. As these two quantities approach each other, the quality of the estimate deteriorates until it is eventually dominated by noise. The filter $H(k)$ should include good estimates of $|\phi_f|$ while excluding poor estimates. To find the regions where good estimates of $|\phi_f|$ are obtained we address the question: Given $\mathbb{E}[|\phi_\epsilon|/(\lambda\phi_Z e^{-\lambda})]$, what is the probability that the calculated values of $\hat{\phi}_f$ in a local region arise largely from noise?

7 COUNT RATE ESTIMATION

The previous estimator assumed $\lambda$ was known. An estimate of $\lambda$ can be obtained without prior knowledge as follows.

1. Using $\hat{\phi}_X$, $\hat{\phi}_{X_1}$, $\hat{\phi}_Z$, G from the previous section, calculate $$\hat{\phi}_Y = \frac{G\hat{\phi}_X}{\phi_Z\phi_{X_1}} \qquad (109)$$

2. Using $\hat{\phi}_Y$, estimate the count rate. This can be done a number of ways.
3. One way is to use an optimization routine or some other means to fit a curve to $\hat{\phi}_Y$. The fitted parameters can be used to obtain an estimate of the count rate.
4. Another way involves estimating the DC offset of $\Psi = d \log(\hat{\phi}_Y)$. This can be done by averaging a suitable number of points of $\Psi$. The points obtained by filtering by $H(u)$ in the previous section are usually suitable, although less points may also produce an adequate estimate.
5. Another way involves using an optimization engine or some other means to fit a curve to $\Psi = d \log(\hat{\phi}_Y)$. A suitable parameterized curve to fit $d \log(\hat{\phi}_Y)$ is given by $$f(u; \lambda, \alpha, \sigma, \mu) = -\lambda + \lambda \sum_{k=0}^{K-1} \alpha_k G(\sigma_k u) e^{-j2\pi u \mu_k} \qquad (110)$$

where $\alpha = (\alpha_0, \cdots, \alpha_{K-1})$ $\qquad (111)$ $\sigma = (\sigma_0, \cdots, \sigma_{K-1})$ $\qquad (112)$ $\mu = (\mu_0, \cdots, \mu_{K-1})$ $\qquad (113)$ and where $K \in \mathbb{N}$ is chosen to allow the curve fit to sufficient accuracy. The parameter $\lambda$ provides an estimate of the count rate. The optimization engine is not required to give equal weighting to each point in $\Psi$.

8 DESCRIPTION OF FIGURES

Figure 10:
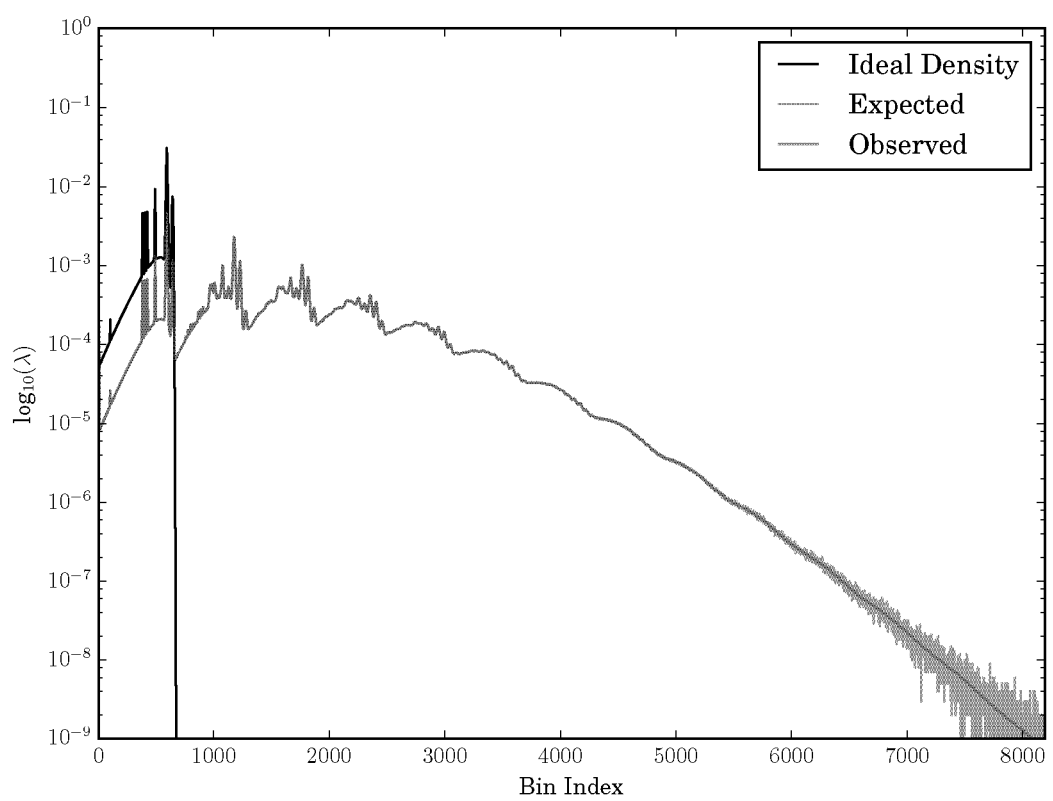
FIG. 10 illustrates the observed and true probability density of input photon energies for the experiment from which FIGS. 9-13 were derived.
Figure 11:
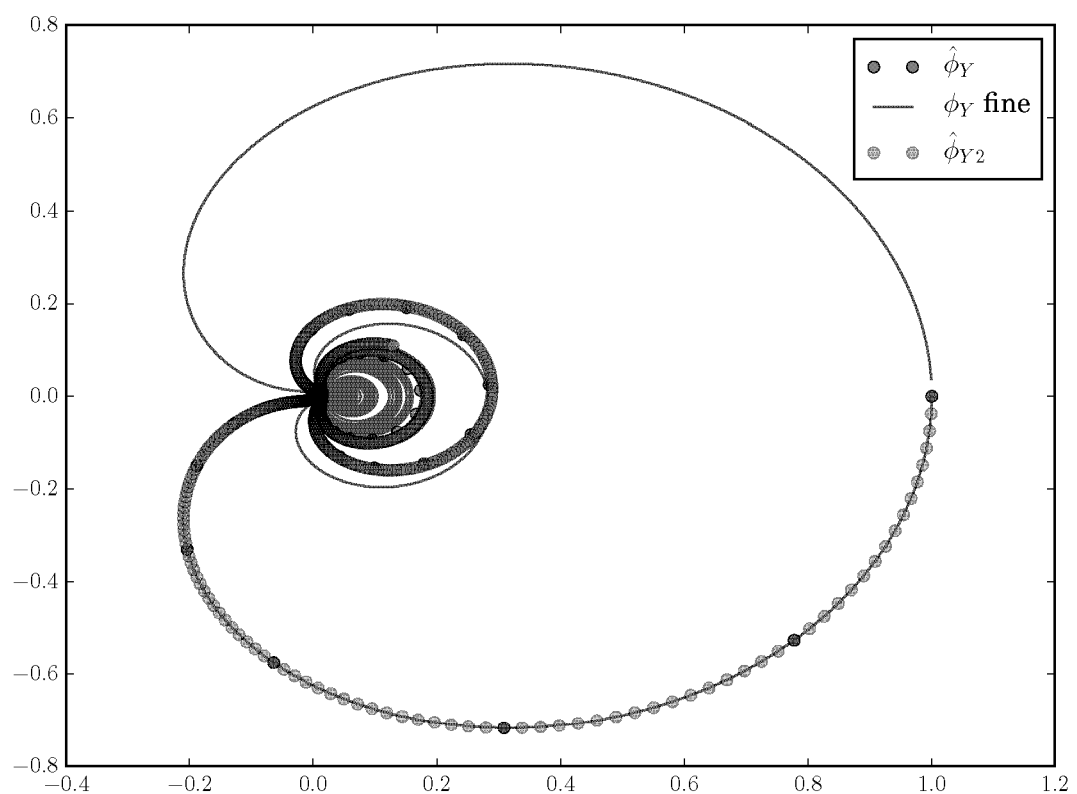
FIG. 11 illustrates the trajectory of the curve γ in the complex plane.
Figure 12:
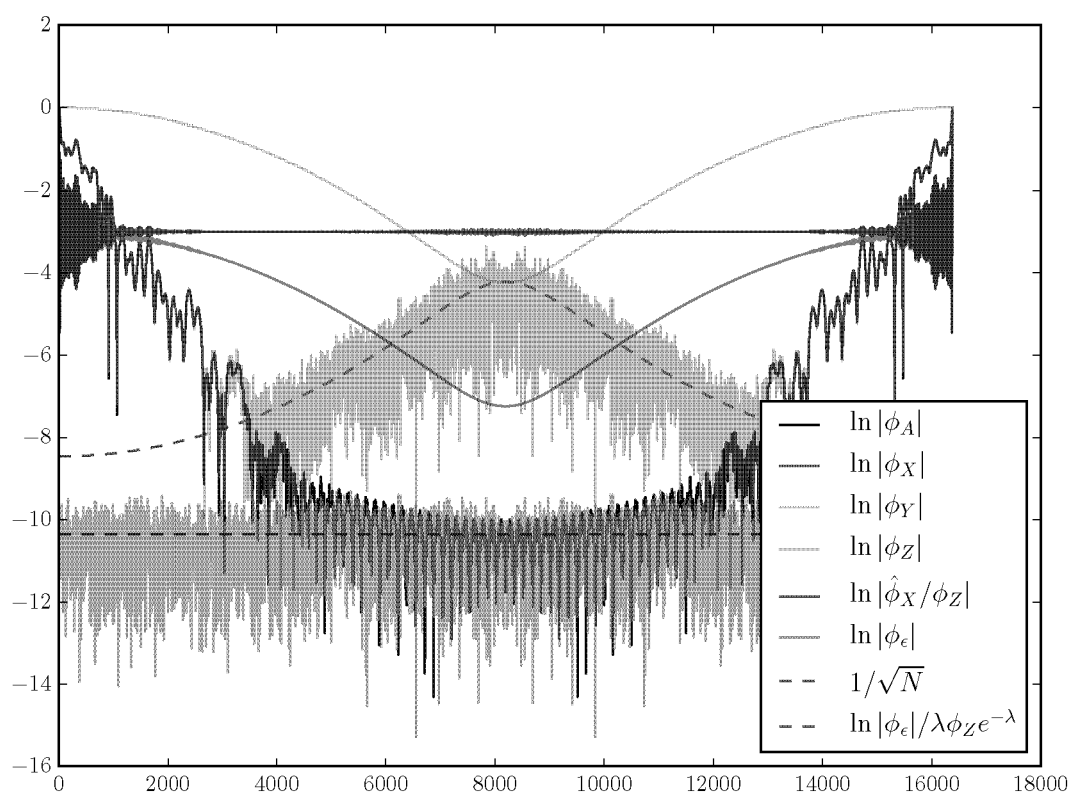
FIG. 12 illustrates internal quantities similar to FIG. 9, however there are some additional signals.
Figure 13:
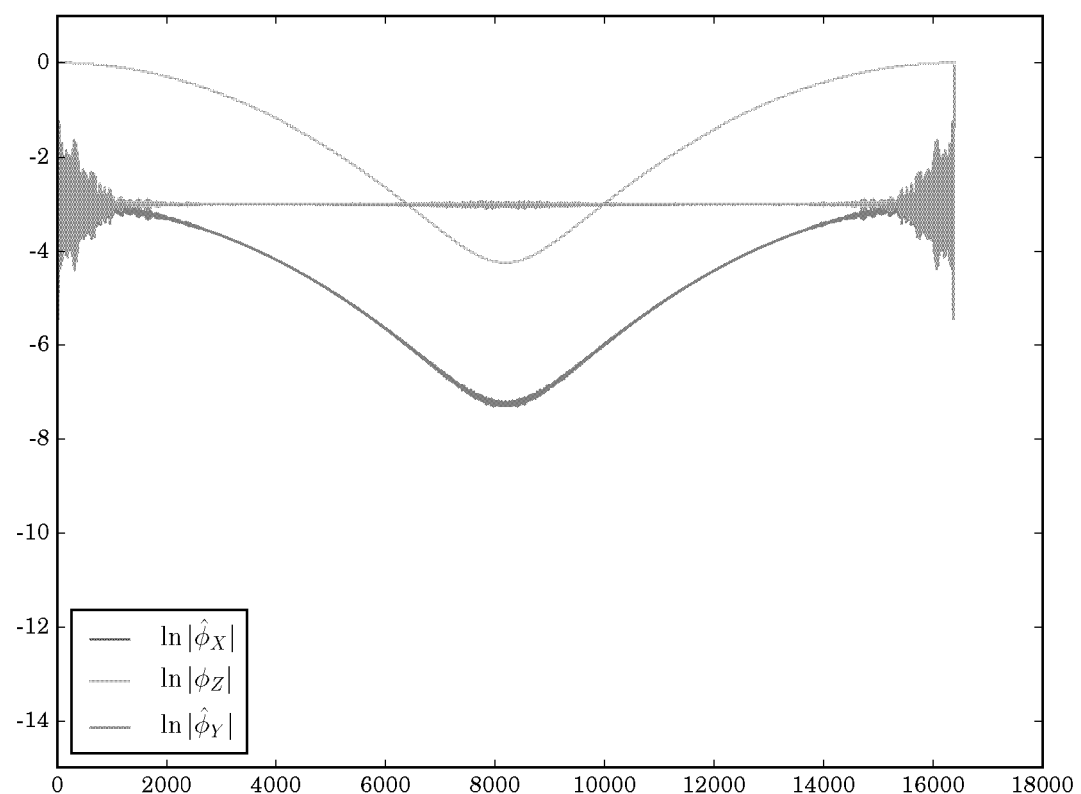
FIG. 13 relates to the 2nd broad aspect of calculating the count rate.

The following figures are to aid understanding of the process. FIG. 1 shows one possible scheme used to partition the detector output. The illustration depicts the sampled detector response to three incident photons. To aid clarity of the figure, the effects of noise have been removed. The output response has been partitioned into several regions of equal length (L). The number of pulses arriving in each region is unknown to the processing system. One pulse has arrived in the first interval. Two pulses have arrived in the second interval. No pulses have arrived in the third interval. The total photon energy arriving within each interval is calculated as the statistic of interest, being the sum of all sample values in each interval. Intervals are not temporally aligned with pulse arrivals. FIG. 2 illustrates the output of the estimation procedure. The true probability density of incident photon energy is plotted as a solid black line. The photons arrival rate is such that three photons on average arriving during any given interval $[T_j, T_j+L)$. The standard deviation of additive noise in the detector output signal s(t) is equal to one histogram bin width. One million intervals were collected. A histogram was made of the total energy in each interval. This is plotted with the blue line. The effects of pile-up is clearly evident, particularly around bins 75, 150 and 225. The red trace plots the estimate of the true incident energy spectrum after the data has been processed by the system. Although some noise appears in the estimate, the effects of pile-up have been removed. The estimate is expected to correctly recover the true incident spectrum on average. This result was obtained using an internal filter whose bandwidth was determined automatically from the data. FIG. 3 illustrates the same quantities as FIG. 2 under the same operating conditions, however in this instance the bandwidth of the internal filter has been determined using asymptotic results from the literature. Although the estimated probability density of incident energies has been recovered, the variance is significantly greater compared to FIG. 2. FIG. 8 illustrates the operation of the system on real data. The blue trace plots the probability density of observed energy values, while the red trace plots the estimated true probability density of incident photon energies. There is no black trace as the true probability density is unknown. In this experiment, X-ray fluorescence of a manganese sample was used as a photon source. The photon arrival rate was around $10^5$ photons per second. The interval length was chosen such that the average time between photons corresponded to the length of two intervals. Sufficient data was collected and partitioned to form $5.9 \times 10^6$ intervals. The standard deviation of the additive noise corresponds to 4.7 histogram bins. The estimation process has clearly reduced the pile-up peaks and enhanced the true peaks. FIG. 9 illustrates various quantities obtained during the simulation of the system described in the 2nd embodiment. It is described in section 5.1 Visualization of Internal Quantities. FIGS. 9-12 relate to the 2nd embodiment. FIG. 10 illustrates the observed and true probability density of input photon energies for the experiment from which FIGS. 9-13 were derived. The black trace plots the true probability density. The red trace plots the density expected to be observed when three photons on average arrive during a given interval length. The blue trace plots the actual observed density. Up to tenth-order pile-up can be seen in the observed density. FIG. 10 included several plots arising from a typical spectroscopic system. The actual incident photon density ('Ideal Density') is plotted with a solid dark line. An observed histogram obtained by partitioning the time-series data is shown in dark blue. Distortion of the spectrum caused by pulse pile-up is evident FIG. 13 plots various internal quantities using a logarithmic vertical axis. The dark blue curve that dips in the centre of the plot is $|\hat{\phi}_X|$. The green quantity that crosses the plot horizontally is $|\hat{\phi}_Y|$. The upper cyan curve that dips in the centre of the plot is $|\phi_Z|$.1 FIG. 11 illustrates the trajectory of the curve $\gamma$ in the complex plane. FIG. 12 illustrates internal quantities similar to FIG. 9, however there are some additional signals. The horizontal red trace that is largely noise, and the corresponding black dashed line represent $|\phi_e|$, the magnitude of the characteristic function of the histogram noise. The transparent green plot that forms the 'noisy peak' in the center of the figure is the estimate $|\hat{\phi}_e|$. This quantity was plotted in blue in FIG. 9, and was barely visible as it was obscured by $|\hat{\phi}_X|/(\lambda\phi_Z e^{-\lambda})$, which is not shown in FIG. 12. The horizontal trace with an average value of −3 is a plot of $|\phi_Y|$. The cyan trace that begins with a value of zero at bin zero, and dips to a minimum around bin 8000 is $|\phi_Z|$, the magnitude of the characteristic function of the additive Gaussian noise. FIG. 13 relates to the 2nd broad aspect of calculating the count rate. It illustrates internal quantities used in the calculation of $\hat{\lambda}$. The cyan trace that begins with a value of zero at bin zero, and dips to a minimum around bin 8000 is $|\phi_Z|$, the magnitude of the characteristic function of the additive Gaussian noise. The dark blue trace that dips to a minimum in the center of the Figure is $|\hat{\phi}_X|$, the estimate of the characteristic function of the observed data. The yellow/green horizontal trace with an average value of −3 is the estimate of $|\phi_Y|$.

REFERENCES

[1] G. F. Knoll, *Radiation Detection and Measurement*, 3rd Edition. New York: Wiley, 2000.

[2] P. A. B. Scoullar and R. J. Evans, "Maximum likelihood estimation techniques for high rate, high throughput digital pulse processing," in 2008 *IEEE Nuclear Science Symposium Conference Record*, pp. 1668-1672, October 2008.

[3] M. Haselman, J. Pasko, S. Hauck, T. Lewellen, and R. Miyaoka, "FPGA-based pulse pile-up correction with energy and timing recovery," *IEEE Transactions on Nuclear Science*, vol. 59, pp. 1823-1830, October 2012.

[4] T. Petrovic, M. Vencelj, M. Lipoglavsek, R. Novak, and D. Savran, "Efficient reduction of piled-up events in gamma-ray spectrometry at high count rates," *IEEE Transactions on Nuclear Science*, vol. 61, pp. 584-589, February 2014.

[5] B. A. VanDevender, M. P. Dion, J. E. Fast, D. C. Rodriguez, M. S. Taubman, C. D. Wilen, L. S. Wood, and M. E. Wright, "High-purity germanium spectroscopy at rates in excess of $10^6$ events/s," *IEEE Transactions on Nuclear Science*, vol. 61, pp. 2619-2627, October 2014.

[6] Y. Sepulcre, T. Trigano, and Y. Ritov, "Sparse regression algorithm for activity estimation in spectrometry," *IEEE Transactions on Signal Processing*, vol. 61, pp. 4347-4359, September 2013.

[7] T. Trigano, I. Gildin, and Y. Sepulcre, "Pileup correction algorithm using an iterated sparse reconstruction method," *IEEE Signal Processing Letters*, vol. 22, pp. 1392-1395, September 2015.

[8] L. Wielopolski and R. P. Gardner, "Prediction of the pulse-height spectral distortion caused by the peak pile-up effect," *Nuclear Instruments and Methods*, vol. 133, pp. 303-309, March 1976.

[9] N. P. Barradas and M. A. Reis, "Accurate calculation of pileup effects in PIXE spectra from first principles," *X-Ray Spectrometry*, vol. 35, pp. 232-237, July 2006.

[10] T. Trigano, A. Souloumiac, T. Montagu, F. Roueff, and E. Moulines, "Statistical pileup correction method for HPGe detectors," *IEEE Transactions on Signal Processing*, vol. 55, pp. 4871-4881, October 2007.

[11] T. Trigano, E. Barat, T. Dautremer, and T. Montagu, "Fast digital filtering of spectrometric data for pile-up correction," *IEEE Signal Processing Letters*, vol. 22, pp. 973-977, July 2015.

[12] P. Ilhe, E. Moulines, F. Roueff, and A. Souloumiac, "Nonparametric estimation of mark's distribution of an exponential shot-noise process," *Electronic Journal of Statistics*, vol. 9, no. 2, pp. 3098-3123, 2015.

[13] P. Ilhe, F. Roueff, E. Moulines, and A. Souloumiac, "Nonparametric estimation of a shot-noise process," in *2016 IEEE Statistical Signal Processing Workshop (SSP)*, pp. 1-4, June 2016.

[14] C. McLean, M. Pauley, and J. H. Manton, "Limitations of decision based pile-up correction algorithms," in *2018 IEEE Statistical Signal Processing Workshop (SSP)*, pp. 693-697, June 2018.

[15] D. Snyder and M. Miller, *Random Point Processes In Time And Space*. New York: Springer-Verlag, 2, revised ed., September 2011.

[16] B. Buchmann and R. Grübel, "Decompounding: An estimation problem for Poisson random sums," *Annals of Statistics*, pp. 1054-1074, 2003.

[17] B. van Es, S. Gugushvili, and P. Spreij, "Deconvolution for an atomic distribution," *Electronic Journal of Statistics*, vol. 2, pp. 265-297, 2008.

[18] S. Gugushvili, *Non-Parametric Inference for Partially Observed Levy Processes*. PhD, University of Amsterdam, Thomas Stieltjes Institute, 2008.

[19] S. Said, C. Lageman, N. Le Bihan, and J. H. Manton, "Decompounding on compact Lie groups," *IEEE Transactions on Information Theory*, vol. 56, pp. 2766-2777, June 2010.

[20] B. van Es, S. Gugushvili, and P. Spreij, "A kernel type nonparametric density estimator for decompounding," *Bernoulli*, vol. 13, pp. 672-694, August 2007.

[21] J. Yu, "Empirical characteristic function estimation and its applications," *Econometric Reviews*, vol. 23, pp. 93-123, December 2004.

The invention claimed is:

1. A method of determining a spectrum of energies of individual quanta of radiation received in a radiation detector, the method comprising the steps of:
   (1) obtaining a time series of digital observations from the radiation detector comprising pulses corresponding to the detection of the individual quanta;
   (2) computing spectrum sensitive statistics from the detector signal, the spectrum sensitive statistics defining a mapping from a density of amplitudes of the pulses to the spectrum sensitive statistics; and
   (3) determining the spectrum by estimating the density of amplitudes of the pulses by applying an inversion of the mapping to the spectrum sensitive statistics.

2. The method of claim 1 further comprising basing the spectrum sensitive statistics on a sum of the digital observations over a plurality of time intervals.

3. The method of claim 2 further comprising defining the mapping using an approximate compound Poisson process.

4. The method of claim 3, further comprising augmenting the approximate compound Poisson process by a modelled noise.

5. The method of claim 4, further comprising expressing the mapping as a relation between characteristic functions of the amplitudes, the spectrum sensitive statistics and the modelled noise.

6. The method of claim 5, further comprising computing the characteristic functions of the spectrum sensitive statistics by applying an inverse Fourier transform to a histogram of the sum of the digital observations.

7. The method of claim 5, further comprising computing the characteristic functions of the amplitudes with a low pass filter.

8. The method of claim 2, further comprising selecting each of the plurality of time intervals to encompass zero or more approximately entire clusters of the pulses, and defining the plurality of time intervals to be nonoverlapping and have a constant length L.

9. The method of claim 8, further comprising requiring a maximum value of the detector signal at a beginning and end of each time interval.

10. The method of claim 8, further comprising defining the approximate compound Poisson process as a sum of the amplitudes of the pulses in each time interval.

11. The method of claim 2, further comprising selecting the plurality of intervals to include: a first set of nonoverlapping time intervals of constant length L without regard to entirety of clusters of the pulses; and a second set of nonoverlapping time intervals of constant length L1 less than L also without regard to entirety of clusters of the pulses; wherein L is at least as long as a duration of the pulses.

12. The method of claim 11, further comprising selecting L1 to be less than the duration of the pulses.

13. The method of claim 1, further comprising using a data driven strategy selected to result in a near optimal choice for a kernel parameter which minimizes an integrated square of errors of an estimated probability density function of the energies of the individual quanta of radiation.

14. A method of estimating count rate of individual quanta of radiation received in a radiation detector, the method comprising the steps of:
   (1) obtaining a time series of digital observations from the radiation detector comprising pulses corresponding to the detection of the individual quanta;
   (2) computing spectrum sensitive statistics from the detector signal, based on a sum of the digital observations over a plurality of time intervals, the spectrum sensitive statistics defining a mapping from a density of amplitudes of the pulses to the spectrum sensitive statistics using an approximate compound Poisson process, the plurality of time intervals including: a first set of nonoverlapping time intervals of constant length L selected without regard to entirety of clusters of the pulses; and a second set of nonoverlapping time intervals of constant length L1 less than L also selected without regard to entirety of clusters of the pulses; wherein L is at least as long as a duration of the pulses;
   (3) determining an estimate of a characteristic function of the approximate compound Poisson process using:

$$\hat{\phi}_y = \frac{G\hat{\phi}_x}{\hat{\phi}_z \hat{\phi}_x}$$

where G is a windowing function, $\hat{\emptyset}_x$ is an estimate of a characteristic function of a sum of the digital observations over each nonoverlapping time interval in the first set, $\hat{\emptyset}_z$ is a characteristic function of a modelled noise process and $\hat{\emptyset}_{x_1}$ is an estimate of a characteristic function of a sum of the digital observations over each nonoverlapping time interval in the second set;

(4) estimating the count rate from the estimate of the characteristic function.

15. The method of claim 14, further comprising estimating the count rate by using an optimization routine or other means to fit a curve, estimating a DC offset of a logarithm of the estimate of the characteristic function, or fitting a curve to the logarithm of the estimate of the characteristic function.

* * * * *